(12) United States Patent
Kusunoki et al.

(10) Patent No.: US 11,455,940 B2
(45) Date of Patent: Sep. 27, 2022

(54) METHOD FOR ACTUATING DISPLAY DEVICE

(71) Applicant: SEMICONDUCTOR ENERGY LABORATORY CO., LTD., Atsugi (JP)

(72) Inventors: Koji Kusunoki, Kanagawa (JP); Kei Takahashi, Kanagawa (JP); Toshiyuki Isa, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 4 days.

(21) Appl. No.: 17/056,687

(22) PCT Filed: May 27, 2019

(86) PCT No.: PCT/IB2019/054363
§ 371 (c)(1),
(2) Date: Nov. 18, 2020

(87) PCT Pub. No.: WO2019/234548
PCT Pub. Date: Dec. 12, 2019

(65) Prior Publication Data
US 2021/0201763 A1 Jul. 1, 2021

(30) Foreign Application Priority Data
Jun. 6, 2018 (JP) .............................. JP2018-108990

(51) Int. Cl.
*G09G 3/32* (2016.01)
(52) U.S. Cl.
CPC ....... *G09G 3/32* (2013.01); *G09G 2300/0439* (2013.01); *G09G 2360/12* (2013.01)

(58) Field of Classification Search
CPC ....... G09G 2354/00; G09G 2300/0426; G09G 2300/0439; G09G 2310/0289;
(Continued)

(56) References Cited

U.S. PATENT DOCUMENTS 6,229,508 B1 5/2001 Kane
6,618,030 B2 9/2003 Kane et al.
(Continued)

FOREIGN PATENT DOCUMENTS

EP 0905673 A 3/1999
JP 11-219146 A 8/1999
(Continued)

OTHER PUBLICATIONS

International Search Report (Application No. PCT/IB2019/054363) dated Sep. 3, 2019.
(Continued)

*Primary Examiner* — Duc Q Dinh
(74) *Attorney, Agent, or Firm* — Nixon Peabody LLP; Jeffrey L. Costellia

(57) ABSTRACT

A display device that inhibits display deterioration is provided. The display device estimates the amount of deterioration of a pixel included in the display device and corrects a first image signal supplied to the pixel. The display device includes a display panel including a plurality of pixels, a frame memory, and an arithmetic portion. The pixels each include a light-emitting element and a transistor supplying a current to the light-emitting element. The arithmetic portion has a function of performing an arithmetic operation in accordance with a regression model. A forecast error parameter and an output parameter are set in the arithmetic portion. The arithmetic portion updates the forecast error parameter from a first observation signal supplied from the frame memory and a second observation signal supplied from the
(Continued)

pixel, in accordance with the regression model, and updates an output parameter by the forecast error parameter in accordance with the regression model. The arithmetic portion corrects the first image signal by the output parameter and generates a second image signal, and the light-emitting element emits light by the second image signal supplied to the transistor included in the pixel.

6 Claims, 19 Drawing Sheets

(58) Field of Classification Search
CPC ......... G09G 2320/045; G09G 2330/02; G09G 2330/021; G09G 2330/028; G09G 2360/12; G09G 3/001; G09G 3/003; G09G 3/32; G09G 3/3233; G09G 3/3275; G09G 3/34; G09G 3/3622; G09G 2300/0819; H01L 51/50
USPC .................................................. 345/73–76
See application file for complete search history.

(56) References Cited

U.S. PATENT DOCUMENTS

| | | | |
|---|---|---|---|
| 7,982,695 B2 | 7/2011 | Mizukoshi et al. | |
| 8,497,857 B2 | 7/2013 | Nakamura | |
| 8,884,852 B2 | 11/2014 | Yamamoto et al. | |
| 8,976,090 B2 | 3/2015 | Yamamoto et al. | |
| 9,035,852 B2 | 5/2015 | Koyama et al. | |
| 9,916,791 B2 | 3/2018 | Kimura et al. | |
| 10,354,586 B2* | 7/2019 | Maeyama ............ G09G 3/3233 | |
| 10,423,254 B2 | 9/2019 | Miyake et al. | |
| 10,678,375 B2 | 6/2020 | Takahashi et al. | |
| 2001/0024186 A1 | 9/2001 | Kane et al. | |
| 2009/0256854 A1 | 10/2009 | Mizukoshi et al. | |
| 2010/0265228 A1* | 10/2010 | Kimura ................ G09G 3/3233 345/207 |
| 2010/0289830 A1 | 11/2010 | Yamamoto et al. | |
| 2011/0069061 A1 | 3/2011 | Nakamura | |
| 2012/0223978 A1 | 9/2012 | Yamamoto et al. | |
| 2013/0249965 A1* | 9/2013 | Nakamura ............. G09G 3/006 345/76 |
| 2016/0140895 A1* | 5/2016 | Park ..................... G09G 3/3208 345/690 |
| 2016/0140898 A1 | 5/2016 | Hyun et al. | |
| 2016/0307518 A1 | 10/2016 | Kimura et al. | |
| 2016/0349904 A1 | 12/2016 | Miyake et al. | |
| 2018/0113564 A1 | 4/2018 | Takahashi et al. | |
| 2020/0278398 A1 | 9/2020 | Isa et al. | |
| 2020/0355749 A1 | 11/2020 | Takahashi et al. | |

FOREIGN PATENT DOCUMENTS

| | | |
|---|---|---|
| JP | 2002-236912 A | 8/2002 |
| JP | 2009-258302 A | 11/2009 |
| JP | 2010-128315 A | 6/2010 |
| JP | 2010-266494 A | 11/2010 |
| JP | 2011-065048 A | 3/2011 |
| JP | 2012-185328 A | 9/2012 |
| JP | 2012-256032 A | 12/2012 |
| JP | 2015-215169 A | 12/2015 |
| JP | 2016-206659 A | 12/2016 |
| JP | 2016-224429 A | 12/2016 |
| JP | 2018-072822 A | 5/2018 |
| KR | 2016-0059578 A | 5/2016 |
| WO | WO-2018/073706 | 4/2018 |

OTHER PUBLICATIONS

Written Opinion (Application No. PCT/IB2019/054363) dated Sep. 3, 2019.

* cited by examiner

FIG. 5A1
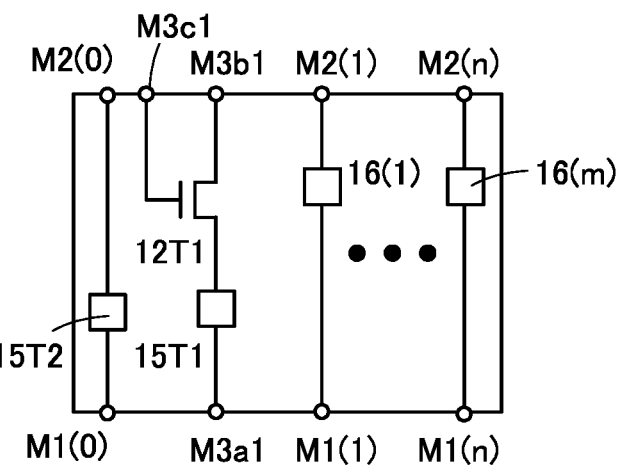
FIG. 5A2
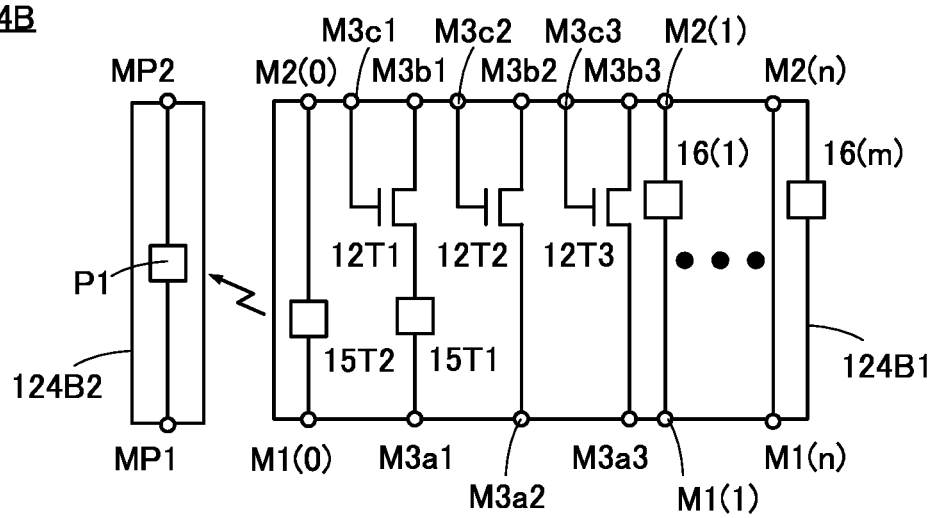
FIG. 5B
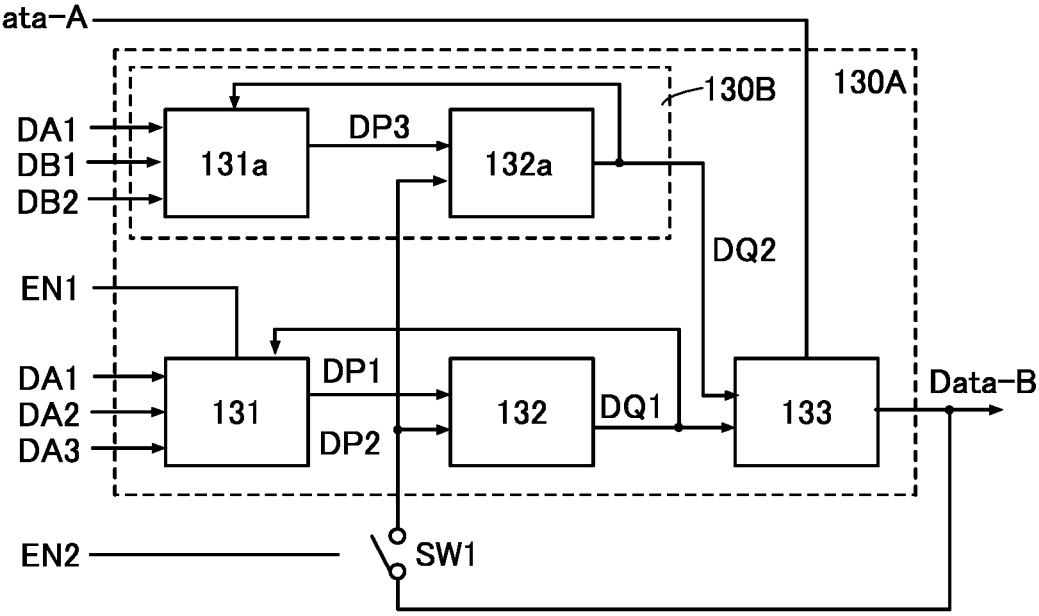

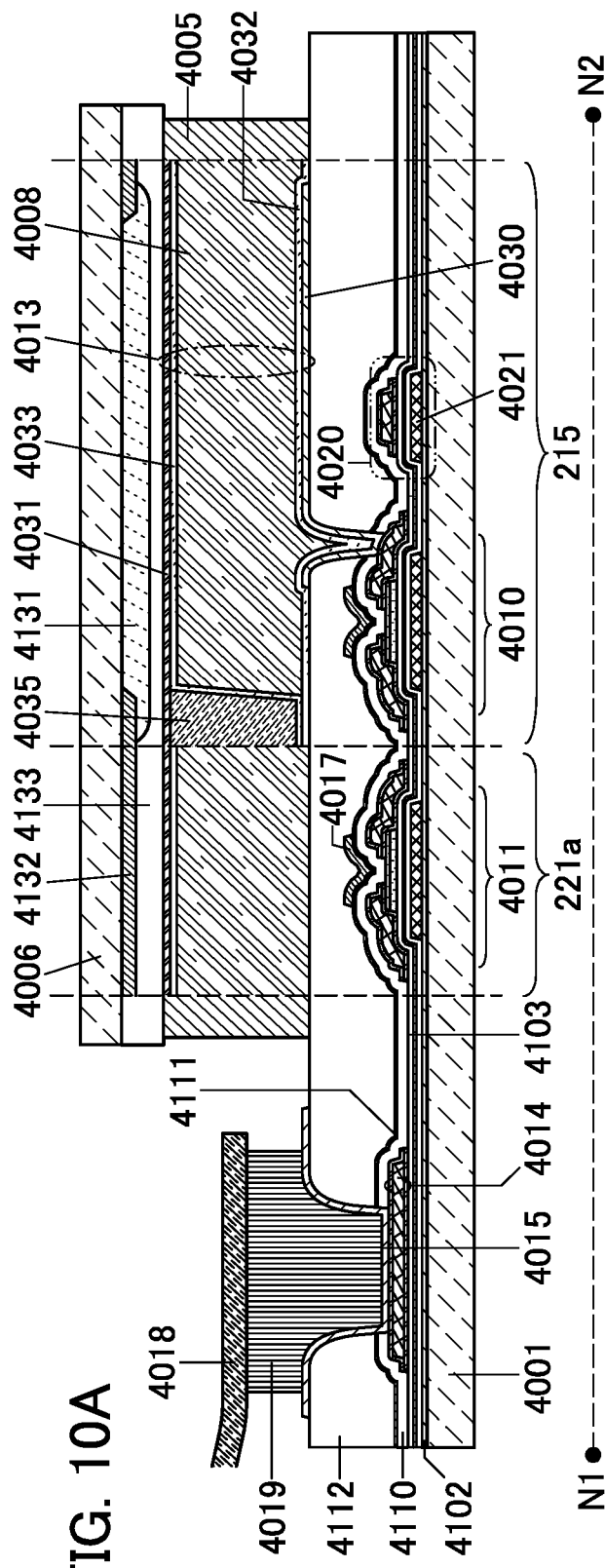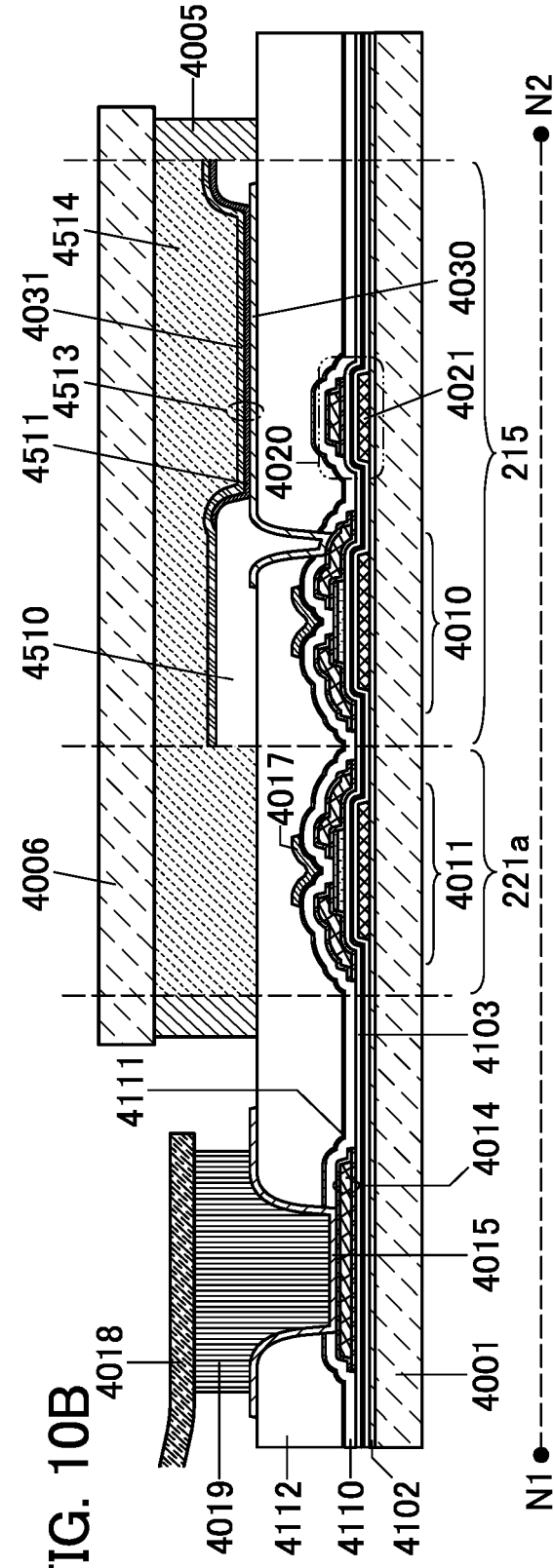
FIG. 10A
FIG. 10B

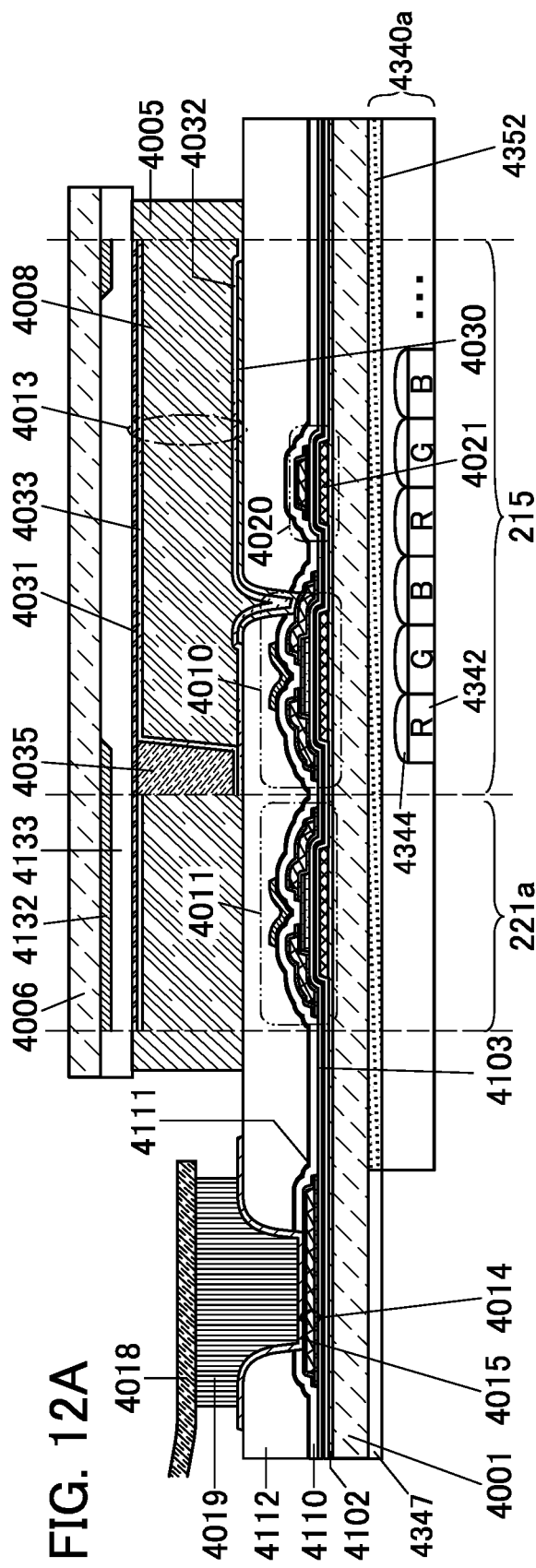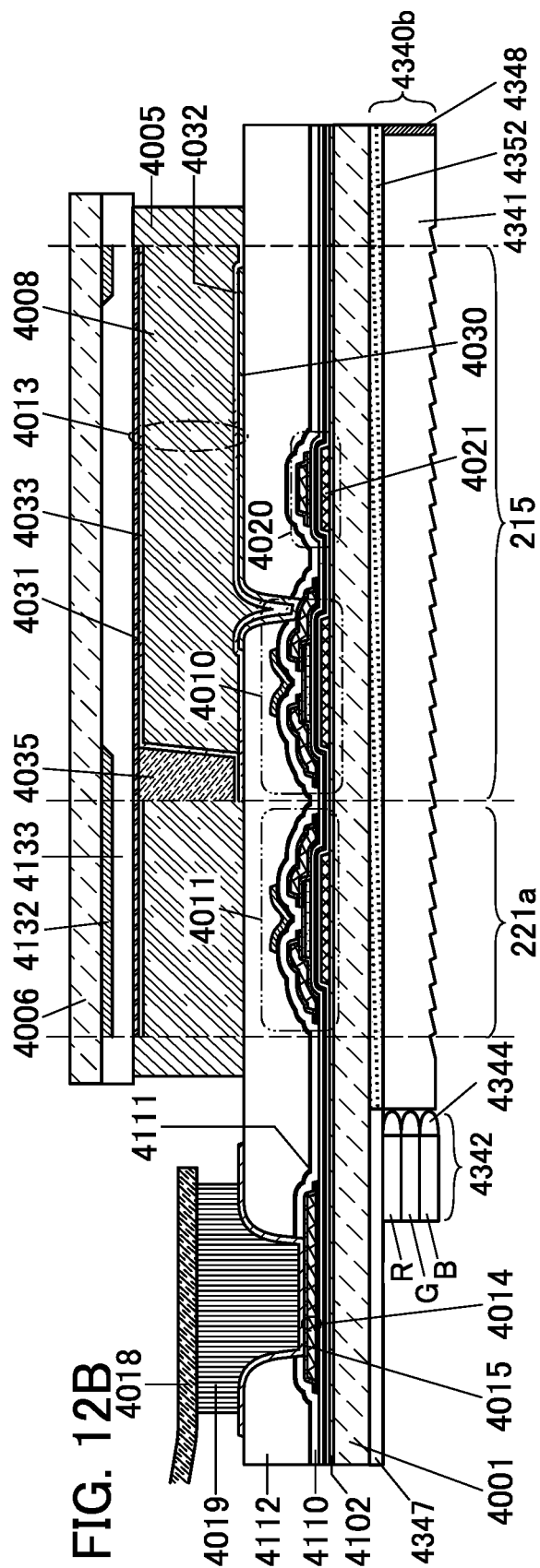

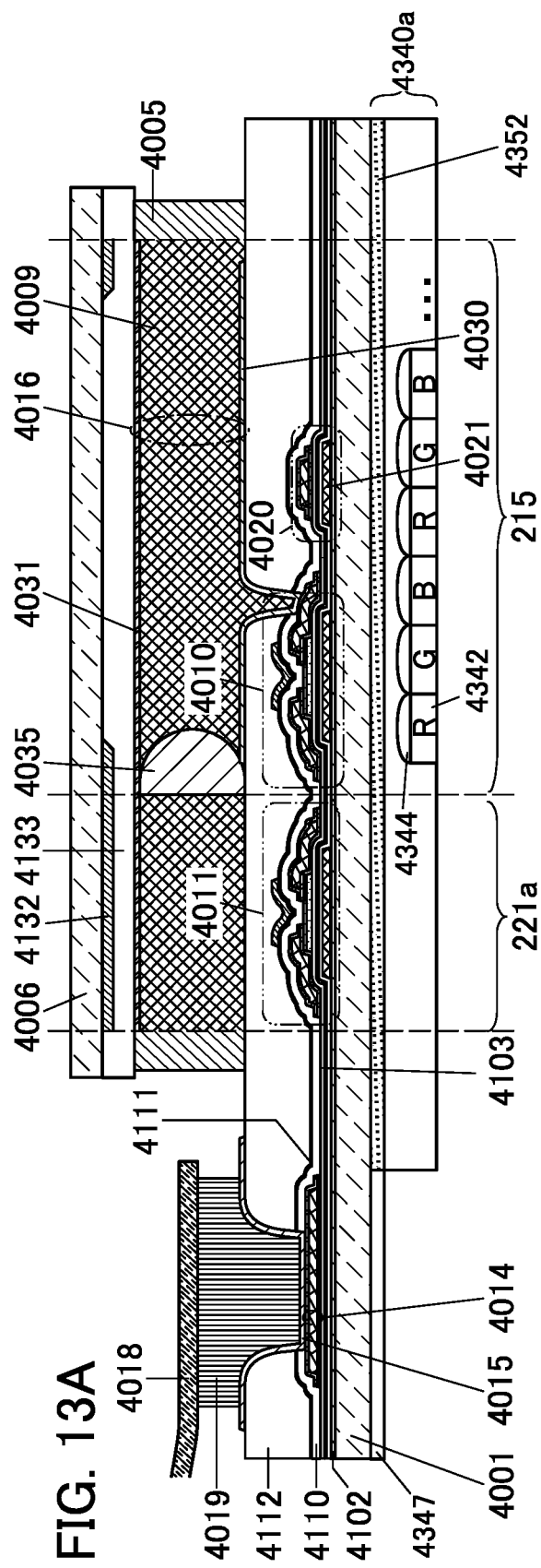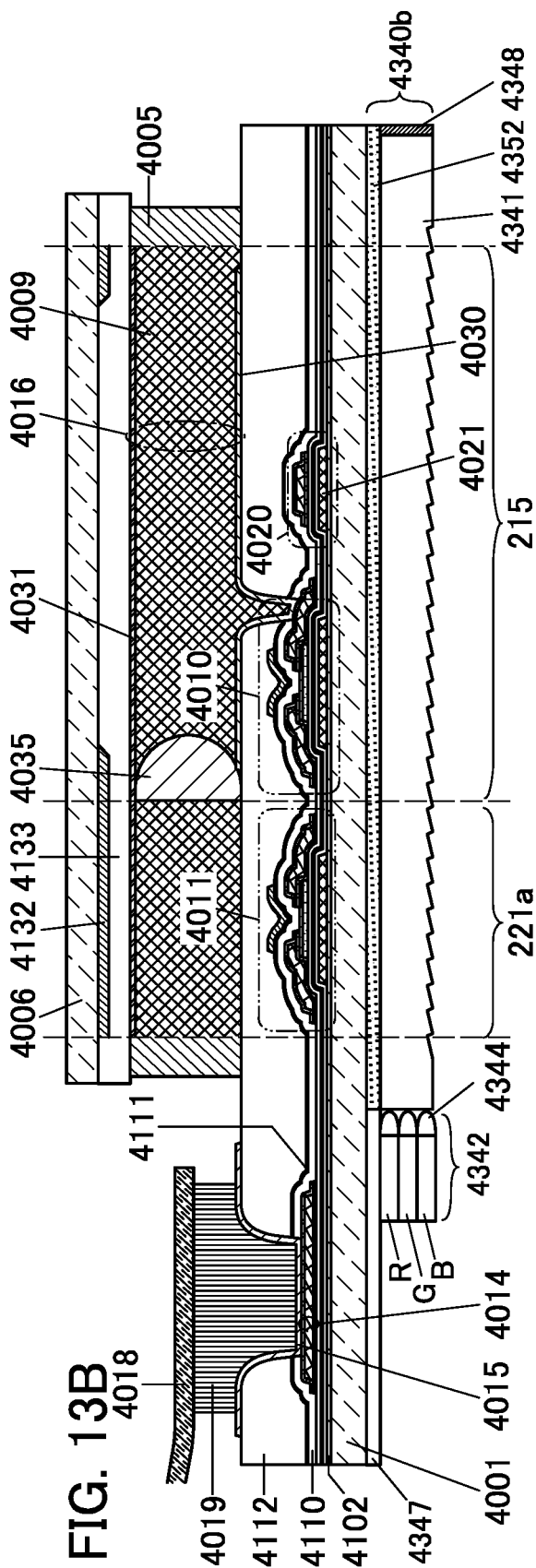

FIG. 15A1
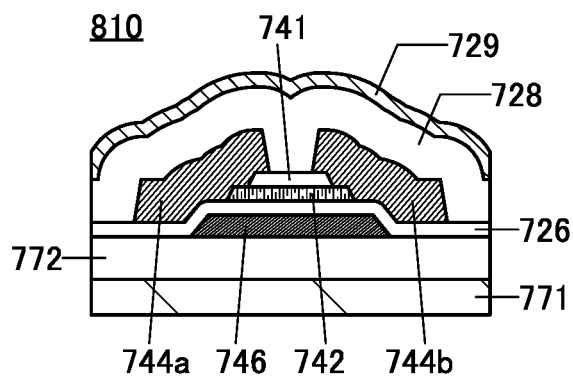
FIG. 15A2
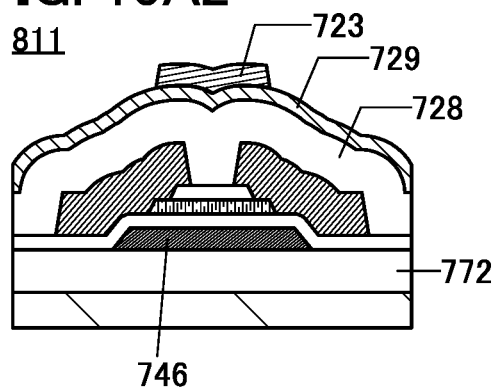
FIG. 15B1
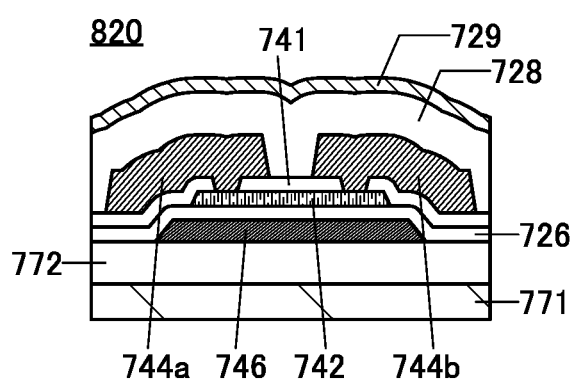
FIG. 15B2
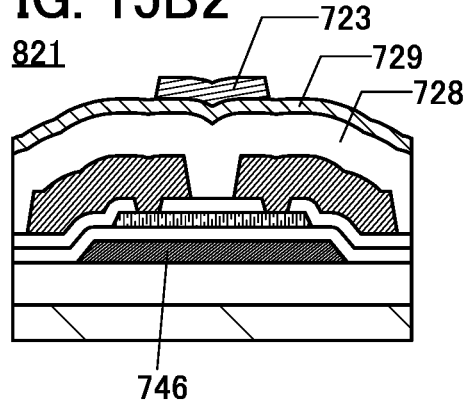
FIG. 15C1
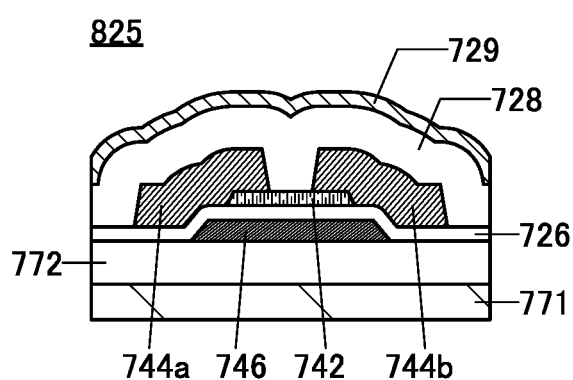
FIG. 15C2
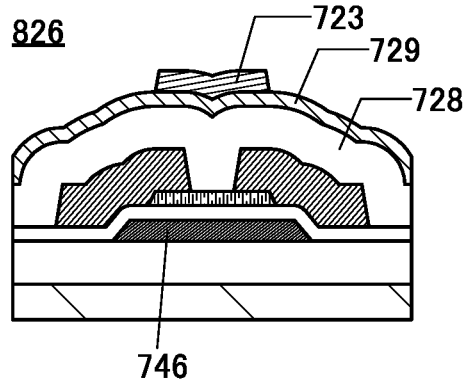

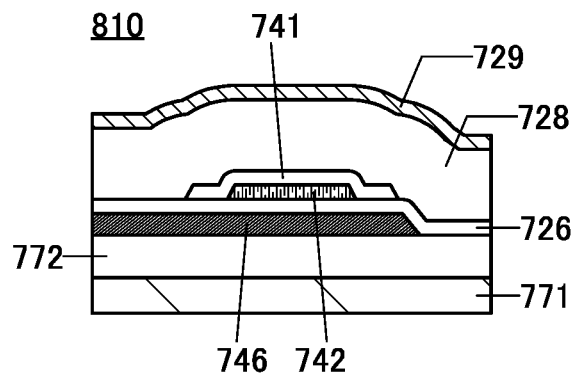
FIG. 16A1
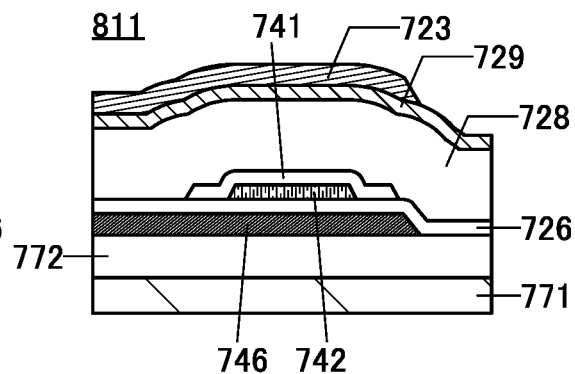
FIG. 16A2
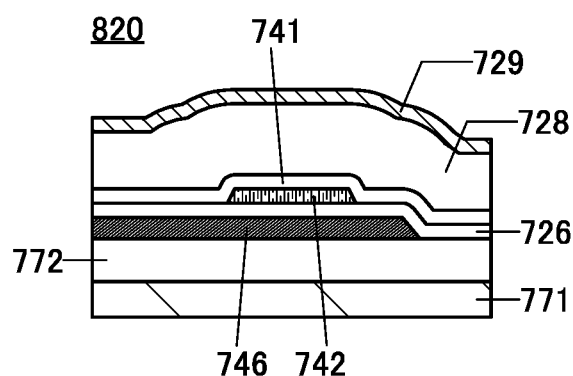
FIG. 16B1
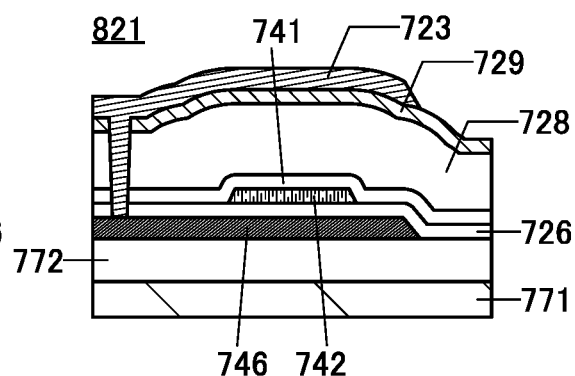
FIG. 16B2
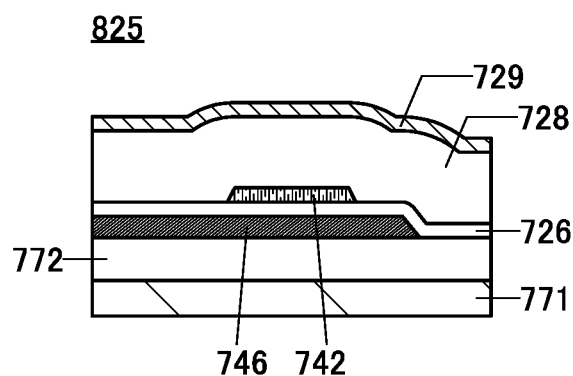
FIG. 16C1
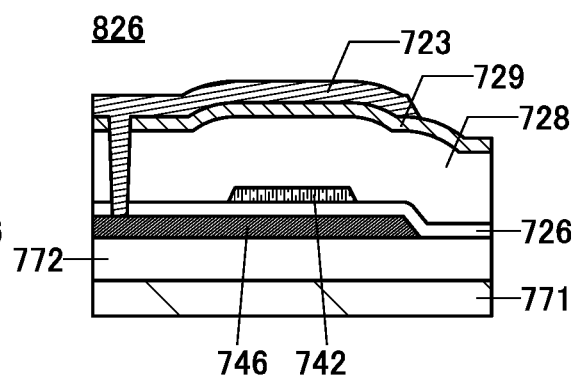
FIG. 16C2

FIG. 17A1
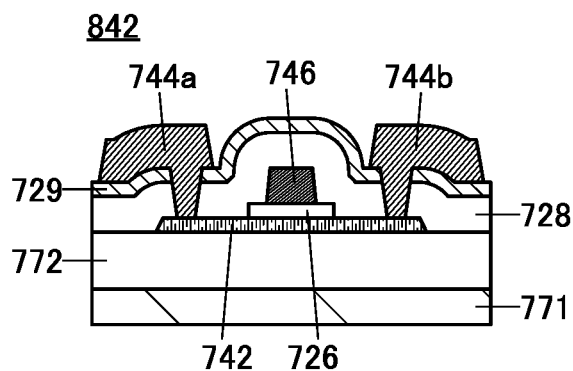
FIG. 17A2
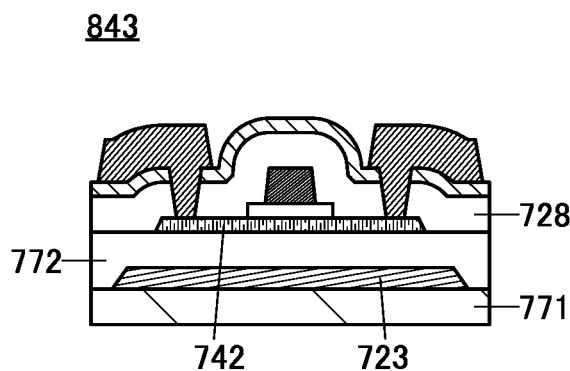
FIG. 17B1
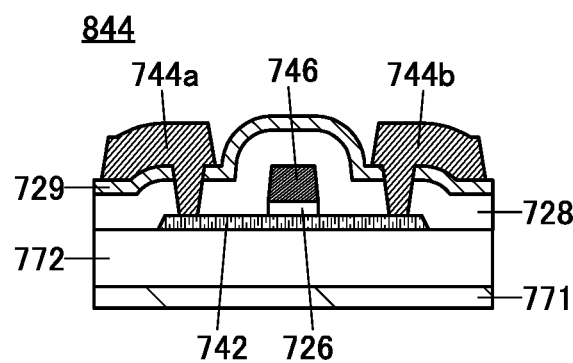
FIG. 17B2
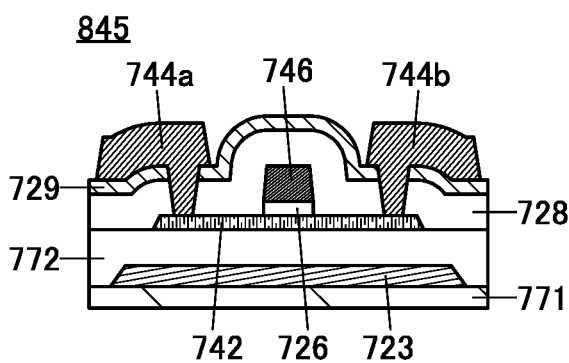
FIG. 17C1
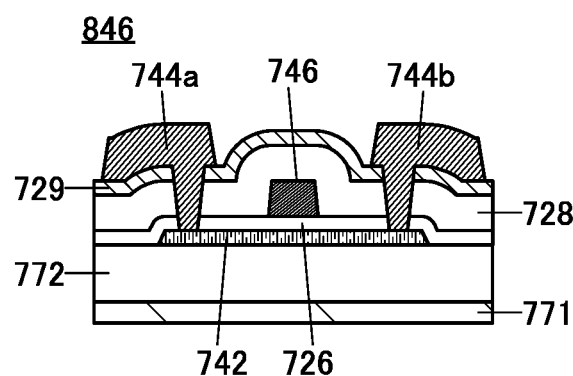
FIG. 17C2
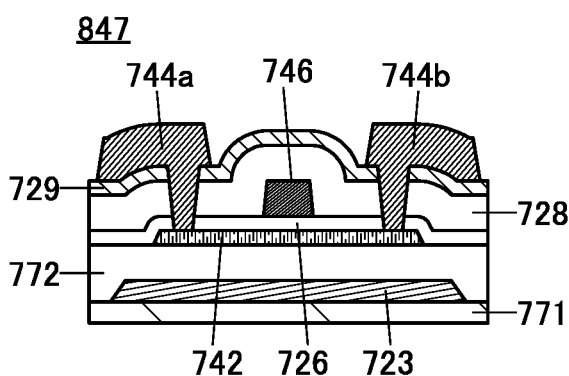

FIG. 18A1
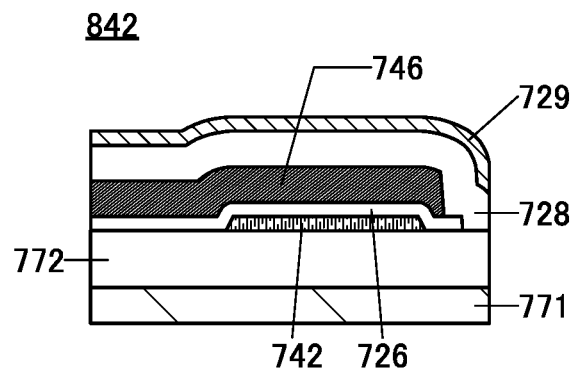
FIG. 18A2
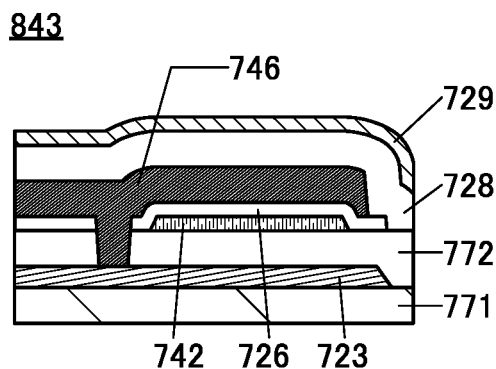
FIG. 18B1
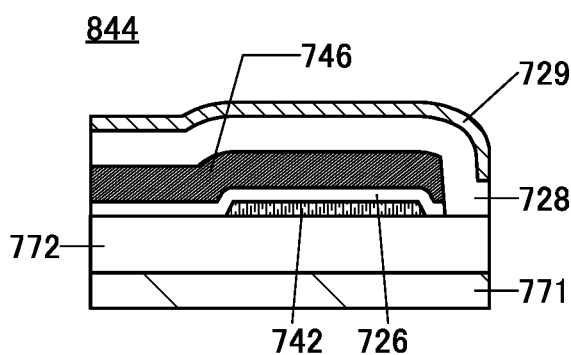
FIG. 18B2
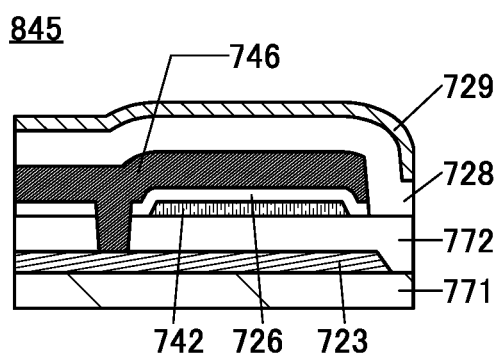
FIG. 18C1
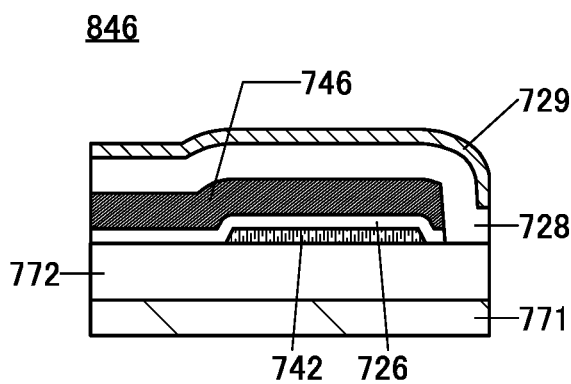
FIG. 18C2
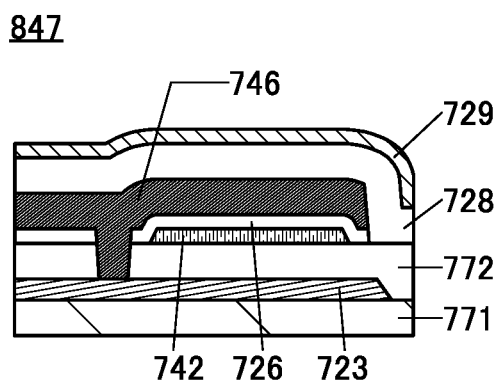

METHOD FOR ACTUATING DISPLAY DEVICE

TECHNICAL FIELD

One embodiment of the present invention relates to a display device and a method for driving the display device.

Note that one embodiment of the present invention is not limited to the above technical field. The technical field of one embodiment of the invention disclosed in this specification and the like relates to an object, a method, or a manufacturing method. Alternatively, the present invention relates to a process, a machine, manufacture, or a composition (a composition of matter). In particular, one embodiment of the present invention relates to a semiconductor device, a display device, a light-emitting device, a power storage device, a memory device, a driving method thereof, or a manufacturing method thereof.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

In recent years, a display device using a light-emitting element has been actively developed. In particular, a display device using a light-emitting element such as an LED (Light Emitting Diode), an OLED (Organic LED), a QLED (Quantum-dot LED), or a semiconductor laser is essential for today's information society, as mobile devices such as mobile phones, smartphones, tablets, e-books, game machines, portable music players, and digital cameras; electronic devices such as monitors, TVs, digital signage, and medical equipment; and human interfaces such as in-vehicle electronic devices.

A display device functioning as a human interface is required to have stable display quality. It is known that the display quality is influenced by a transistor used in a display device, deterioration or variation of a light-emitting element, or the like. When a transistor deteriorates and then the amount of current supplied to a light-emitting element is changed, light output characteristics of the light-emitting element deteriorate and, leading to deterioration of the display quality.

For example, Patent Document 1 discloses a driving method that corrects a threshold voltage of a transistor supplying a current to a light-emitting element.

REFERENCE

Patent Document

[Patent Document 1] Japanese Published Patent Application No. 2012-256032

SUMMARY OF THE INVENTION

Problems to be Solved by the Invention

In a display device using a light-emitting element, a driving method that corrects the threshold voltage of a transistor supplying a current to the light-emitting element and stabilizes a current supplied to a light-emitting element has been proposed. However, since display quality depends not only on characteristics of a transistor supplying a current to a light-emitting element but also on characteristics of a light-emitting element, deterioration of the light-emitting element cannot be corrected by only correcting the threshold voltage of the transistor and as a result, there is a problem of deterioration of display quality.

In view of the above problem, an object of one embodiment of the present invention is to provide a novel method for driving a display device. Another object of one embodiment of the present invention is to provide a driving method that corrects deterioration of a transistor. Another object of one embodiment of the present invention is to provide a driving method that corrects deterioration of a light-emitting element.

Note that the description of these objects does not preclude the existence of other objects. One embodiment of the present invention does not have to achieve all these objects. Other objects are apparent from and can be derived from the description of the specification, the drawings, the claims, and the like.

Note that the objects of one embodiment of the present invention are not limited to the objects listed above. The objects listed above do not preclude the existence of other objects. The other objects are objects that are not described in this section and will be described below. The objects that are not described in this section will be derived from the descriptions of the specification, the drawings, and the like and can be extracted from these descriptions by those skilled in the art. Note that one embodiment of the present invention is to solve at least one of the objects listed above and/or the other objects.

Means for Solving the Problems

One embodiment of the present invention is a method for driving a display device which estimates the amount of deterioration of a pixel included in the display device and corrects a first image signal supplied to the pixel. The display device includes a display panel, a frame memory, and an arithmetic portion. The display panel includes a plurality of pixels. The pixels each include a light-emitting element and a transistor supplying a current to the light-emitting element. The arithmetic portion has a function of performing calculation in accordance with a regression model. A first observation signal and a second observation signal are supplied to the arithmetic portion. The first observation signal is a third image signal supplied to the arithmetic portion from the frame memory, and the second observation signal is a first value of current flowing through one of the light-emitting element included in the pixel and the transistor supplying the current to the light-emitting element or a first value of voltage converted from the first value of current. A forecast error parameter and an output parameter are set in the arithmetic portion. One embodiment of the present invention is a method for driving a display device in which the arithmetic portion updates the forecast error parameter from the first observation signal and the second observation signal in accordance with the regression model, and updates an output parameter by the forecast error parameter in accordance with the regression model, and in which the arithmetic portion corrects the first image signal supplied from the frame memory by the output parameter and generates a second image signal, and the light-emitting element emits light by the second image signal supplied to the transistor included in the pixel.

One embodiment of the present invention is a method for driving a display device which estimates the amount of deterioration of a pixel included in the display device and corrects a first image signal supplied to the pixel. The display device includes a display panel, a frame memory, and an arithmetic portion. The display panel includes a plurality of pixels. The pixels each include a light-emitting element and a transistor supplying a current to the light-emitting element. The arithmetic portion has a function of performing calculation in accordance with a regression model. A forecast error parameter updated irregularly and an output parameter are set in the arithmetic portion. One embodiment of the present invention is a method for driving a display device in which the arithmetic portion updates the output parameter by the forecast error parameter set in advance in accordance with the regression model, corrects the first image signal supplied from the frame memory by the output parameter and generates a second image signal, and the light-emitting element emits light by the second image signal supplied to the transistor included in the pixel.

One embodiment of the present invention is a method for driving a display device which estimates the amount of deterioration of a pixel included in the display device and corrects a first image signal supplied to the pixel. The display device includes a display panel, a frame memory, and an arithmetic portion. The display panel includes a plurality of pixels. The pixels each include a light-emitting element and a transistor supplying a current to the light-emitting element. The arithmetic portion has a function of performing an arithmetic operation in accordance with a regression model. A first observation signal and a second observation signal are supplied to the arithmetic portion. The first observation signal is a third image signal supplied to the arithmetic portion from the frame memory. The second observation signal is a first value of current flowing through one of the light-emitting element included in the pixel and the transistor supplying the current to the light-emitting element or a first value of voltage converted from the first value of current. A forecast error parameter and an output parameter are set in the arithmetic portion. The arithmetic portion updates the forecast error parameter from the first observation signal and the second observation signal in accordance with the regression model. The arithmetic portion updates the output parameter by the forecast error parameter in accordance with the regression model. The first image signal supplied from the frame memory and the output parameter are supplied to the pixel. The pixel corrects the first image signal by the output parameter and generates a second image signal. One embodiment of the present invention is a method for driving a display device in which the light-emitting element emits light by the second image signal generated by the pixel.

In each of the above structures, it is preferable that in a method for driving a display device, the regression model be a Kalman filter on the basis of a state equation.

In each of the above structures, it is preferable that in a method for driving a display device, the display device include a monitor circuit, the monitor circuit include a monitoring transistor, a second value of current flowing through the monitoring transistor or a second value of voltage converted from the second value of current be supplied to the arithmetic portion as a third observation signal, and the arithmetic portion update the forecast error parameter using the first observation signal, the second observation signal, and the third observation signal.

In each of the above structures, it is preferable that in a method for driving a display device, the display device include a monitor circuit, the monitor circuit include a monitoring light-emitting element, a third value of current flowing through the monitoring light-emitting element or a third value of voltage converted from the third value of current be supplied to the arithmetic portion as a third observation signal, and the arithmetic portion update the forecast error parameter using the first observation signal, the second observation signal, and the third observation signal.

In each of the above structures, it is preferable that in a method for driving a display device, the display device include a transistor, and the transistor include a metal oxide in a semiconductor layer.

In each of the above structures, it is preferable that in a method for driving a display device, the transistor including the metal oxide in the semiconductor layer include a back gate.

Effect of the Invention

According to one embodiment of the present invention, a novel method for driving a display device can be provided. Another embodiment of the present invention can provide a driving method that corrects deterioration of a transistor. Another embodiment of the present invention can provide a driving method that corrects deterioration of a light-emitting element.

Note that the objects of one embodiment of the present invention are not limited to the objects listed above. The objects listed above do not preclude the existence of other objects. The other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and/or the other effects. Therefore, one embodiment of the present invention does not have the effects listed above in some cases.

BRIEF DESCRIPTION OF THE DRAWINGS

FIGS. 5 (A1) and (A2) Diagrams each illustrating a monitor circuit. (B) A diagram illustrating a display device.
FIG. 10 Diagrams each illustrating a display device.
FIG. 12 Diagrams each illustrating a display device.
FIG. 13 Diagrams each illustrating a display device.
FIG. 15 Diagrams each illustrating a transistor.
FIG. 16 Diagrams each illustrating a transistor.
FIG. 17 Diagrams each illustrating a transistor.

FIG. 18 Diagrams each illustrating a transistor.

MODE FOR CARRYING OUT THE INVENTION

Figure 1:
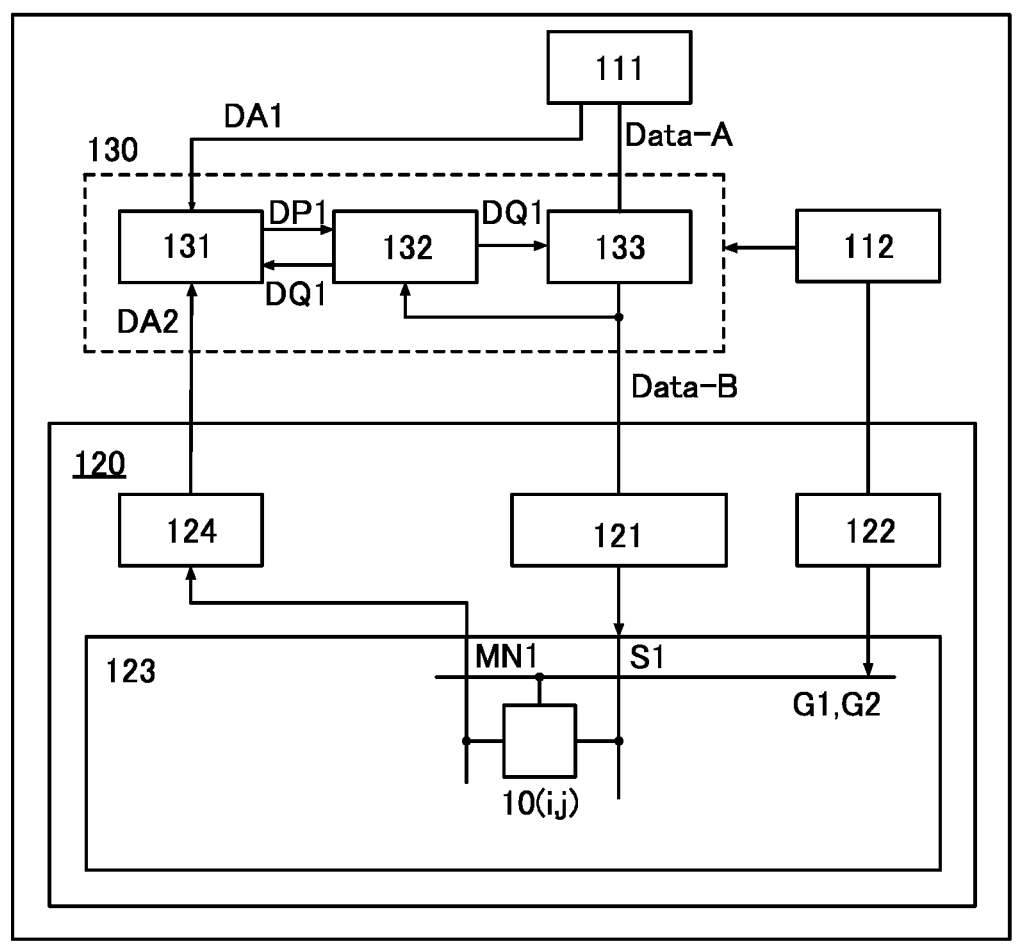
FIG. 1 A diagram illustrating a display device.

Hereinafter, embodiments are described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Thus, they are not limited to the illustrated scale. Note that the drawings are schematic views illustrating ideal examples, and embodiments of the present invention are not limited to shapes or values shown in the drawings.

Furthermore, it is noted that ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. The positional relation between components is changed as appropriate in accordance with a direction in which each component is described. Thus, without limitation to terms described in this specification, the description can be changed appropriately depending on the situation.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and can make current flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Thus, the terms of source and drain are interchangeably used in this specification and the like.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "parallel" indicates a state where two straight lines are placed at an angle of greater than or equal to −10° and less than or equal to 10°. Thus, the case where the angle is greater than or equal to −5° and less than or equal to 5° is also included. Moreover, "perpendicular" indicates a state where two straight lines are placed at an angle of greater than or equal to 80° and less than or equal to 100°. Thus, the case where the angle is greater than or equal to 85° and less than or equal to 95° is also included.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

Unless otherwise specified, off-state current in this specification and the like refers to a drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to a drain current at the time when the voltage Vgs between its gate and source is lower than the threshold voltage Vth.

The off-state current of a transistor depends on Vgs in some cases. Thus, the off-state current of a transistor is lower than or equal to I sometimes means that there is Vgs with which the off-state current of the transistor becomes lower than or equal to I. The off-state current of a transistor sometimes refers to the off-state current in an off state at predetermined Vgs, in an off state at Vgs in a predetermined range, in an off state at Vgs with which sufficiently reduced off-state current is obtained, or the like.

As an example, the assumption is made of an n-channel transistor where the threshold voltage Vth is 0.5 V, and the drain current at Vgs of 0.5 V is $1 \times 10^{-9}$ A, the drain current at Vgs of 0.1 V is $1 \times 10^{-13}$ A, the drain current at Vgs of −0.5 V is $1 \times 10^{-19}$ A, and the drain current at Vgs of −0.8 V is $1 \times 10^{-22}$ A. The drain current of the transistor is lower than or equal to $1 \times 10^{-19}$ A at Vgs of −0.5 V or at Vgs in the range of −0.5 V to −0.8 V; therefore, it is sometimes said that the off-state current of the transistor is lower than or equal to $1 \times 10^{-19}$ A. Since there is Vgs at which the drain current of the transistor is lower than or equal to $1 \times 10^{-22}$ A, it is sometimes said that the off-state current of the transistor is lower than or equal to $1 \times 10^{-22}$ A.

In this specification and the like, the off-state current of a transistor having a channel width W is sometimes represented by the value of flowing current per channel width W. Alternatively, it is sometimes represented by the value of flowing current per given channel width (e.g., 1 μm). In the latter case, the off-state current is sometimes represented by the unit with the dimension of current per length (e.g., A/μm).

The off-state current of a transistor depends on temperature in some cases. Unless otherwise specified, the off-state current in this specification sometimes refers to off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The off-state current of the transistor being lower than or equal to I sometimes means that there is Vgs at which the off-state current of a transistor is lower than or equal to I at room temperature, 60° C., 85° C., 95° C., 125° C., a temperature at which reliability of a semiconductor device or the like including the transistor is ensured, or a temperature at which the semiconductor device or the like including the transistor is used (e.g., any temperature in the range of 5° C. to 35° C.).

The off-state current of a transistor depends on the voltage Vds between its drain and source in some cases. Unless otherwise specified, the off-state current in this specification sometimes refers to an off-state current at Vds of 0.1 V, 0.8V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds used in the semiconductor device or the like including the transistor. The off-state current of the transistor being lower than or equal to I sometimes means that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device or the like including the transistor is ensured, or at Vds used in the semiconductor device or the like including the transistor.

In the above description of the off-state current, the drain may be replaced with the source. That is, the off-state current sometimes refers to a current that flows through a source of a transistor in an off state.

In this specification and the like, leakage current sometimes expresses the same meaning as off-state current. Furthermore, in this specification and the like, the off-state current sometimes refers to current that flows between a source and a drain of a transistor in an off state, for example.

Note that a voltage refers to a potential difference between two points, and a potential refers to electrostatic energy (electric potential energy) of a unit charge at a given point in an electrostatic field. Note that in general, a potential difference between a potential at a given point and a reference potential (e.g., a ground potential) is simply called potential or voltage, and potential and voltage are used as synonymous words in many cases. Therefore, in this specification, a potential may be rephrased as a voltage and a voltage may be rephrased as a potential unless otherwise specified.

Embodiment 1

In this embodiment, a driving method of a display device, which inhibits deterioration of display quality, is described with reference to FIG. 1 to FIG. 7. Deterioration of display quality refers to display with a different gray level from a supplied image signal due to a change in electrical characteristics of a transistor or a light-emitting element included in a pixel.

First, a structure of a display device is described. The display device includes a display panel, an arithmetic portion, a frame memory, and a timing control portion. The display panel includes a source driver, a gate driver, a display region, and a monitor circuit. The display region includes a plurality of pixels, and each pixel includes a light-emitting element and a transistor for supplying current to the light-emitting element.

The arithmetic portion included in the display device can estimate the amount of deterioration of the pixels using a forecast error parameter and an output parameter in accordance with a regression model, and can correct an image signal supplied to the pixels. In other words, the deterioration of display quality can be inhibited when the arithmetic portion corrects the image signal supplied from the frame memory in accordance with the regression model and supplies the corrected image signal to the pixels.

For the regression model, a Kalman filter or the like is preferably used. Note that the regression model is not limited to the Kalman filter and may perform estimation by a least-squares method or the like. Alternatively, a neural network may be used for the estimation. For example, a configuration called a Long Short-Term Memory (LSTM), which is one of recurrent neural networks (RNN), can be used. In LSTM, a hidden layer stores a state with a memory cell in RNN, and analysis, such as prediction, on a longer period of time can be performed, whereby the amount of deterioration of the transistor or the light-emitting element can be estimated and corrected.

Next, a driving method of the display device is described focusing on the arithmetic portion. A first observation signal and a second observation signal are supplied to the arithmetic portion. The first observation signal is a third image signal supplied to the arithmetic portion from the frame memory. The third image signal is an image signal supplied to the pixel.

The second observation signal is a first value of current which flows through any one of a light-emitting element of a pixel to which the third image signal is supplied or a transistor which supplies current to a light-emitting element. For example, the pixel outputs a current flowing through the transistor at a certain time as the first value of current. Furthermore, the pixel may output currents flowing through the light-emitting element at different times as the first value of current. Note that the first value of current may be converted into a voltage value and supplied to the arithmetic portion as the second observation signal. As a method for converting a value of current into a value of voltage, there is a method for easily performing conversion using a resistor, a capacitor, a diode, a transistor, or the like.

It is preferable that the arithmetic portion include a forecast error parameter and an output parameter, and an output parameter functioning as a regression model in which learning has been performed in advance be set. The forecast error parameter and the output parameter are described below.

The arithmetic portion updates the forecast error parameter using the first observation signal and the second observation signal of the target pixel in accordance with the regression model. Next, the arithmetic portion updates the output parameter using the forecast error parameter in accordance with the regression model. Then, the arithmetic portion corrects a first image signal supplied from the frame memory using the output parameter and generates a second image signal. The light-emitting element emits light when the second image signal is supplied to the transistor included in the pixel. The forecast error parameter and the output parameter are always updated, whereby the first image signal can be favorably and successively corrected and the second image signal can be generated. Note that the generated second image signal is supplied to the arithmetic portion and the output parameter is updated.

As another example, the output parameter may correct the first image signal supplied from the frame memory and may generate the second image signal. In this case, the output parameter generates the second image signal using the forecast error parameter updated in advance by the first observation signal and the second observation signal that are irregularly supplied. The light-emitting element emits light when the second image signal generated by the output parameter is supplied to the transistor included in the pixel.

That is, the arithmetic portion can generate the second image signal from the first image signal using the output parameter. Even when the forecast error parameter and the output parameter are not always updated, the forecast error parameter can be updated as appropriate in response to deterioration characteristics of the transistor or the light-emitting element. Thus, the first image signal can be corrected and the second image signal can be generated even when the forecast error parameter and the output parameter are updated at different timings. Note that the forecast error parameter is updated irregularly; thus, successively is reduced, but the amount of arithmetic operation of the arithmetic portion can be reduced and power consumption can be reduced.

The monitor circuit included in the display panel can include a monitoring transistor having the same electrical characteristics and the same size of a channel formation region as the transistor that supplies a current to the light-emitting element included in the pixel. Alternatively, a monitoring transistor with a large channel width may be used. The use of a monitoring transistor with a large channel width enables the amount of deterioration of electrical characteristics of the transistor to be easily detected.

A second value of current flowing through the monitoring transistor can be supplied to the arithmetic portion as a third observation signal. Thus, it is preferable that the arithmetic portion update the forecast error parameter using the first observation signal, the second observation signal, and the third observation signal. Comparing the amount of deterioration of a monitoring transistor different from the transistor increases the amount of information, so that correction can be more accurately performed. Note that the second value of current may be converted into a second value of voltage to be supplied as the third observation signal.

The monitor circuit can include a monitoring light-emitting element. The monitor circuit preferably includes a monitoring light-emitting element having the same size and the same electrical characteristics as the light-emitting element included in the pixel. A third value of current flowing through the monitoring light-emitting element can be supplied as a fourth observation signal to the arithmetic portion. Thus, the arithmetic portion updates the forecast error parameter using the first observation signal, the second observation signal, and the fourth observation signal. Comparing the amount of deterioration of a monitoring light-emitting element different from the light-emitting element increases the amount of information for predicting an error, so that correction can be more accurately performed. Note that the third value of current may be converted into a third value of voltage to be supplied as the fourth observation signal.

Note that the forecast error parameter may be updated using the monitoring transistor and the monitoring light-emitting element at the same time. For example, the arithmetic portion updates the forecast error parameter using the first observation signal, the second observation signal, the third observation signal, and the fourth observation signal. Comparing the amounts of deterioration of a monitoring transistor different from the transistor and a monitoring light-emitting element different from the light-emitting element increases the amount of information for predicting an error, so that correction can be accurately performed.

Furthermore, the display device can include a monitoring optical sensor. The monitoring optical sensor is preferably used in combination with the monitoring light-emitting element. The amount of deterioration of the monitoring light-emitting element is not determined only by a change in the current, and it is possible to supply a fourth value of current detected by the monitoring optical sensor to the arithmetic portion as a fifth observation signal. The arithmetic portion updates the forecast error parameter using the first observation signal to the fifth observation signal. Comparing the amounts of deterioration of a monitoring transistor and a monitoring light-emitting element different from the transistor and the light-emitting element, respectively, increases the amount of information for predicting an error, so that correction can be more accurately performed. Note that the fourth value of current may be converted into a fourth value of voltage to be supplied as the fifth observation signal.

It is preferable that a learned output parameter be set in the arithmetic portion. Moreover, the forecast error parameter is updated by a combination of any two or more of the first observation signal to the fifth observation signal, so that correction can be accurately performed in accordance with the amount of deterioration of the pixel. That is, one embodiment of the present invention can provide a driving method that corrects deterioration of a pixel which affects display quality of a novel display device. One embodiment of the present invention can provide a driving method that corrects deterioration of a transistor which affects display quality. One embodiment of the present invention can provide a driving method that corrects deterioration of a light-emitting element which affects display quality.

Next, the structure of the display device is described in detail with reference to a block diagram of a display device illustrated in FIG. 1.

A display device 100 includes a display panel 120, an arithmetic portion 130, a frame memory 111, and a timing control portion 112. The arithmetic portion includes a first arithmetic portion 131, a second arithmetic portion 132, and a correction arithmetic portion 133. The display panel 120 includes a source driver 121, a gate driver 122, a display region 123, and a monitor circuit 124. The display region 123 includes a pixel 10(1,1) to a pixel 10(m,n). FIG. 1 illustrates a pixel 10(i,j) as an example. Here, m and n are each a positive integer greater than or equal to 2, i is a positive integer greater than or equal to 1 and less than or equal to m, and j is a positive integer greater than or equal to 1 and less than or equal to n.

The frame memory 111, the timing control portion 112, and the monitor circuit 124 are electrically connected to the arithmetic portion 130. The arithmetic portion 130 is electrically connected to the source driver 121. The source driver 121 and the gate driver 122 are electrically connected to the display region 123. The display region 123 is electrically connected to the arithmetic portion 130 through the monitor circuit 124.

The arithmetic portion 130 includes a plurality of parameters, and the parameters are subjected to arithmetic operation or updated by a plurality of observation signals. Note that the arithmetic operation or the update of the parameters is replaced with management of the parameters in some cases. The observation signals are preferably the amount of deterioration of a current flowing through a pixel. The amount of deterioration of the current flowing through the pixel is, for example, the amount of deterioration of a value of a current flowing through a light-emitting element included in a pixel, the amount of deterioration of a value of current flowing through a transistor that supplies a current to a light-emitting element, or the amount of deterioration of light output characteristics of a light-emitting element. The pixel 10 is described in detail in FIG. 2(A).

The parameters are roughly classified into a forecast error parameter and an output parameter and managed. The forecast error parameter is a parameter managed by the first arithmetic portion 131, and the output parameter is a parameter managed by the second arithmetic portion 132. The first arithmetic portion performs an arithmetic operation of a Kalman filter, and the second arithmetic portion performs an arithmetic operation of an internal state model. The parameter output from the second arithmetic portion preferably includes a threshold voltage or mobility of a transistor, for example. In addition, the content of the output parameter is fed back to the first arithmetic portion. The correction arithmetic portion 133 can generate an image signal Data-B from an image signal Data-A supplied from the frame memory 111 using the output parameter.

The arithmetic portion 130 can estimate the amount of deterioration of the pixel 10 using the forecast error parameter and the output parameter in accordance with the regression model and correct an image signal supplied to the pixel 10. In other words, the deterioration of display quality can be inhibited when the arithmetic portion 130 corrects the image signal Data-A supplied from the frame memory 111 in accordance with the regression model and supplies the image signal Data-B generated from the image signal Data-A to the pixel. For the regression model, a Kalman filter or the like is preferably used.

Moreover, the correction arithmetic portion 133 preferably supplies the image signal Data-B to the pixel 10 through the source driver 121 and also supplies the image signal Data-B to the second arithmetic portion 132. By supplying the image signal Data-B to the second arithmetic portion 132, the output parameter can be updated to be a learning data in the case where the next image signal Data-B is generated.

Note that the timing control portion 112 controls the timing of the arithmetic portion 130 and the gate driver 122. The gate driver 122 can supply a scan signal to the display region 123, and the source driver 121 can supply the image signal Data-B output from the arithmetic portion 130 to the pixel 10 in synchronization with the scan signal. The timing control portion 112 can control the timing at which the pixel 10 outputs an observation signal to the monitor circuit 124 using the gate driver 122.

Figure 2A:
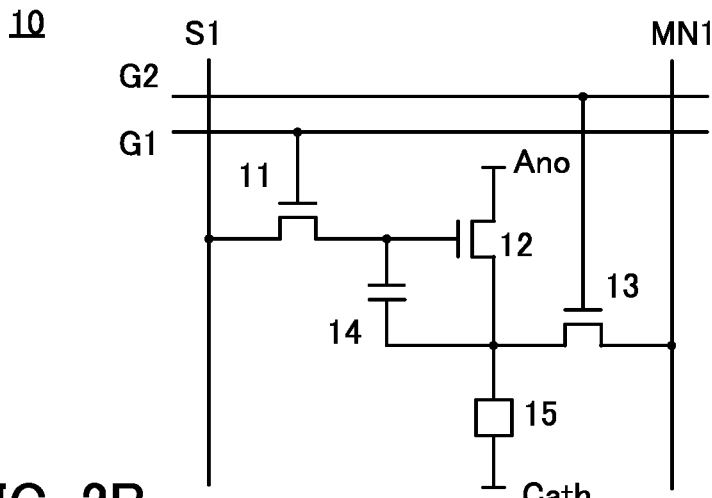
FIG. 2 (A) A diagram illustrating a pixel. (B) A diagram illustrating a monitor circuit. (C) A diagram illustrating a display device.
Figure 2B:
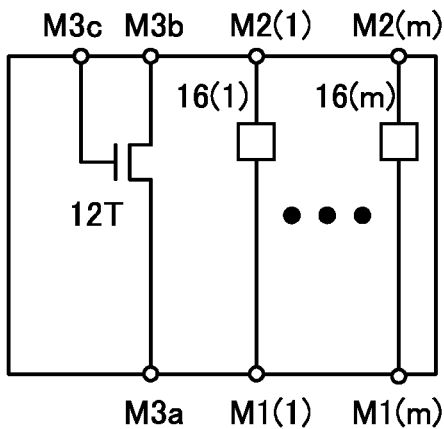
Figure 2C:
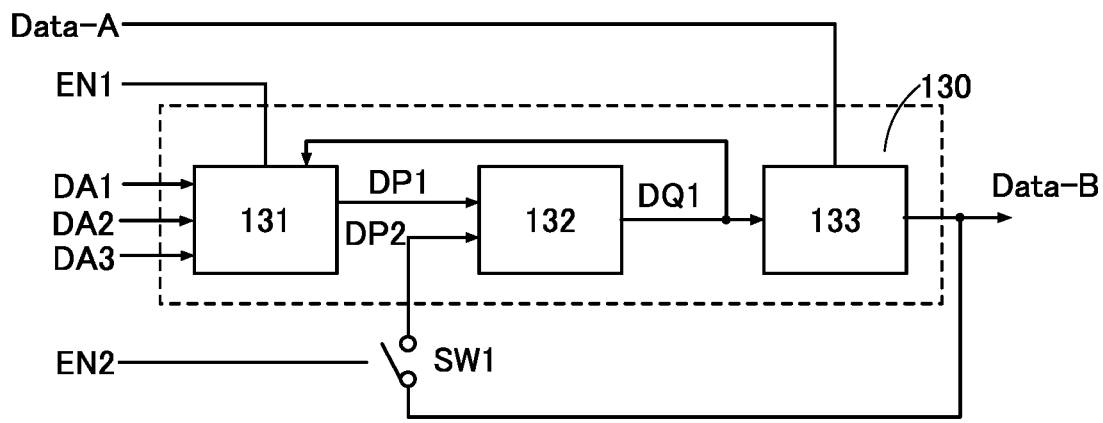

Next, the driving method of the display device is described in detail with reference to FIG. 2. FIG. 2(A) is an example of a detailed circuit diagram of the pixel 10 included in the display panel 120. FIG. 2(B) is an example of a circuit diagram of the monitor circuit 124. FIG. 2(C) is an example of a detailed block diagram of the arithmetic portion 130.

A wiring G1, a wiring G2, a wiring S1, a wiring MN1, a wiring Ano, and a wiring Cath are connected to the pixel 10 illustrated in FIG. 2(A). The pixel 10 includes a transistor 11, a transistor 12, a transistor 13, a capacitor 14, and a light-emitting element 15.

A gate of the transistor 11 is electrically connected to the wiring G1. One of a source and a drain of the transistor 11 is electrically connected to the wiring S1. The other of the source and the drain of the transistor 11 is electrically connected to a gate of the transistor 12 and one electrode of the capacitor 14. One of a source and a drain of the transistor 12 is electrically connected to one electrode of the light-emitting element 15, one of a source and a drain of the transistor 13, and the other electrode of the capacitor 14. The other of the source and the drain of the transistor 12 is electrically connected to the wiring Ano. The other electrode of the light-emitting element 15 is electrically connected to the wiring Cath. The other of the source and the drain of the transistor 13 is electrically connected to the wiring MN1.

Different scan signals are supplied to the pixel 10 from the gate driver 122 through the wiring G1 and the wiring G2. The image signal Data-B is supplied to the pixel 10 through the wiring S1. The pixel 10 outputs a current, which flows to the pixel 10 through the wiring MN1, as an observation signal DA2 through the monitor circuit 124. Note that the observation signal is either of the current flowing through the transistor 12 or the current flowing through the light-emitting element 15. The observation signal DA2 is described in detail in FIG. 2(C).

Note that the transistors preferably include an oxide semiconductor film that is highly purified to inhibit the formation of oxygen vacancies. The transistors can each have a low off-state current. Accordingly, an electrical signal such as an image signal can be held for a long time. Thus, frequency of refresh operation can be reduced, which leads to lower power consumption. The transistor including an oxide semiconductor film is described in detail in Embodiment 5.

Next, the details of the monitor circuit 124 are described with reference to the circuit diagram in FIG. 2(B).

For example, the monitor circuit 124 includes the same number of a terminal M1(1) to a terminal M1(m) and a terminal M2(1) to a terminal M2(m) as those of the wiring MN1. The terminals M1 are electrically connected to the corresponding terminals M2. Note that the terminal M1 may be connected to the terminal M2 through a current-voltage conversion element 16 or may be connected to the terminal M2 without through the current-voltage conversion element 16. The terminal M2 can supply the observation signal DA2 to the first arithmetic portion 131.

The monitor circuit 124 may further include a monitoring transistor 12T. One of a source and a drain of the transistor 12T is electrically connected to a terminal M3a. The other of the source and the drain of the transistor 12T is electrically connected to a terminal M3b. A gate of the transistor 12T is electrically connected to a terminal M3c. The terminal M3b can supply an observation signal DA3 to the first arithmetic portion 131. A fixed potential is supplied to the terminal M3a and a monitoring image signal is supplied to the terminal M3c. Monitoring image signals having different potentials are supplied to the monitoring image signal so that the amount of deterioration of the transistor 12T can be detected.

Note that the transistor 12T is preferably a transistor having the same size of a channel formation region and the same electrical characteristics as the transistor 12. Alternatively, a transistor with a large channel width may be used. The use of the transistor with a large channel width enables the amount of deterioration of electrical characteristics of the transistor 12T to be easily detected.

Next, the details of the arithmetic portion 130 are described with reference to the block diagram in FIG. 2(C). The arithmetic portion 130 includes the first arithmetic portion 131, the second arithmetic portion 132, and the correction arithmetic portion 133. An observation signal DA1, the observation signal DA2, and the observation signal DA3 are supplied to the first arithmetic portion 131.

The observation signal DA1 is supplied with an image signal from the frame memory. In the case where the image signal generated from the image signal Data-A by the arithmetic portion 130 is the image signal Data-B, the image signal already supplied to the target pixel 10 can be an image signal Data-C. That is, the image signal Data-C is supplied to the observation signal DA1.

The current flowing through the transistor 12 owing to the image signal Data-C supplied to the pixel 10 is supplied to the observation signal DA2 through the transistor 13, the wiring MN1, and the monitor circuit 124 in this order. The current flowing through the light-emitting element 15 may also be supplied to the observation signal DA2 through the transistor 13, the wiring MN1, and the monitor circuit 124 in this order. Note that in the case where the current flowing through the light-emitting element 15 is supplied to the observation signal DA2, it is preferable that the current not flow through the transistor 12. For example, when the potential supplied to the wiring Ano is the same as the potential supplied to the wiring MN1, the current ceases flowing to the transistor 12. Furthermore, the current can flow only to the light-emitting element 15 when the potential supplied to the wiring Cath is lower than the potentials supplied to the wiring Ano and the wiring MN1.

The amount of deterioration of the light-emitting element 15 is preferably detected in a region where the current flowing through the light-emitting element 15 and light output characteristics of the light-emitting element 15 have a linear relation. Alternatively, the amount of deterioration of the light-emitting element 15 may be detected in a region where the current and the light output characteristics do not have a linear relation. For example, the current of the case where the light-emitting element does not emit light or a reverse bias current which flows when a voltage higher than that of an anode terminal is applied to a cathode terminal of the light-emitting element may be used as the observation signal DA2. Note that the observation signal DA2 may be converted into a value of voltage by the current-voltage conversion element 16.

The first arithmetic portion 131 can update the forecast error parameter when two different pieces of observation data are supplied. Note that the first arithmetic portion 131 can update the forecast error parameter more accurately when a larger number of observation signals, such as the observation signal DA3, are supplied, for example. Therefore, two or more observation signals are preferably supplied to the first arithmetic portion 131, further preferably three or more observation signals are supplied.

A forecast error parameter DP1 calculated by the first arithmetic portion 131 is supplied to the second arithmetic portion 132. The second arithmetic portion 132 updates an output parameter DQ1 with the forecast error parameter DP1, and the output parameter DQ1 is supplied to the correction arithmetic portion 133. Note that in the second arithmetic portion 132, it is preferable that the output parameter DQ1 be updated by the image signal Data-B before a new image signal Data-A is supplied to the correction arithmetic portion 133.

The correction arithmetic portion 133 can generate the image signal Data-B from the new image signal Data-A, which is supplied from the frame memory 111, with the use of the output parameter DQ1, and supply the image signal Data-B to the pixel 10. The generated image signal Data-B is supplied to the second arithmetic portion 132 and the output parameter DQ1 can be updated.

Note that a signal EN1 can bring the first arithmetic portion 131 into a sleep state. The first arithmetic portion 131 is brought into the sleep state, whereby the power consumption can be reduced. In addition, a signal EN2 can control a switch SW1 and prevent the output parameter DQ1 from being updated by the image signal Data-B.

Figure 3:
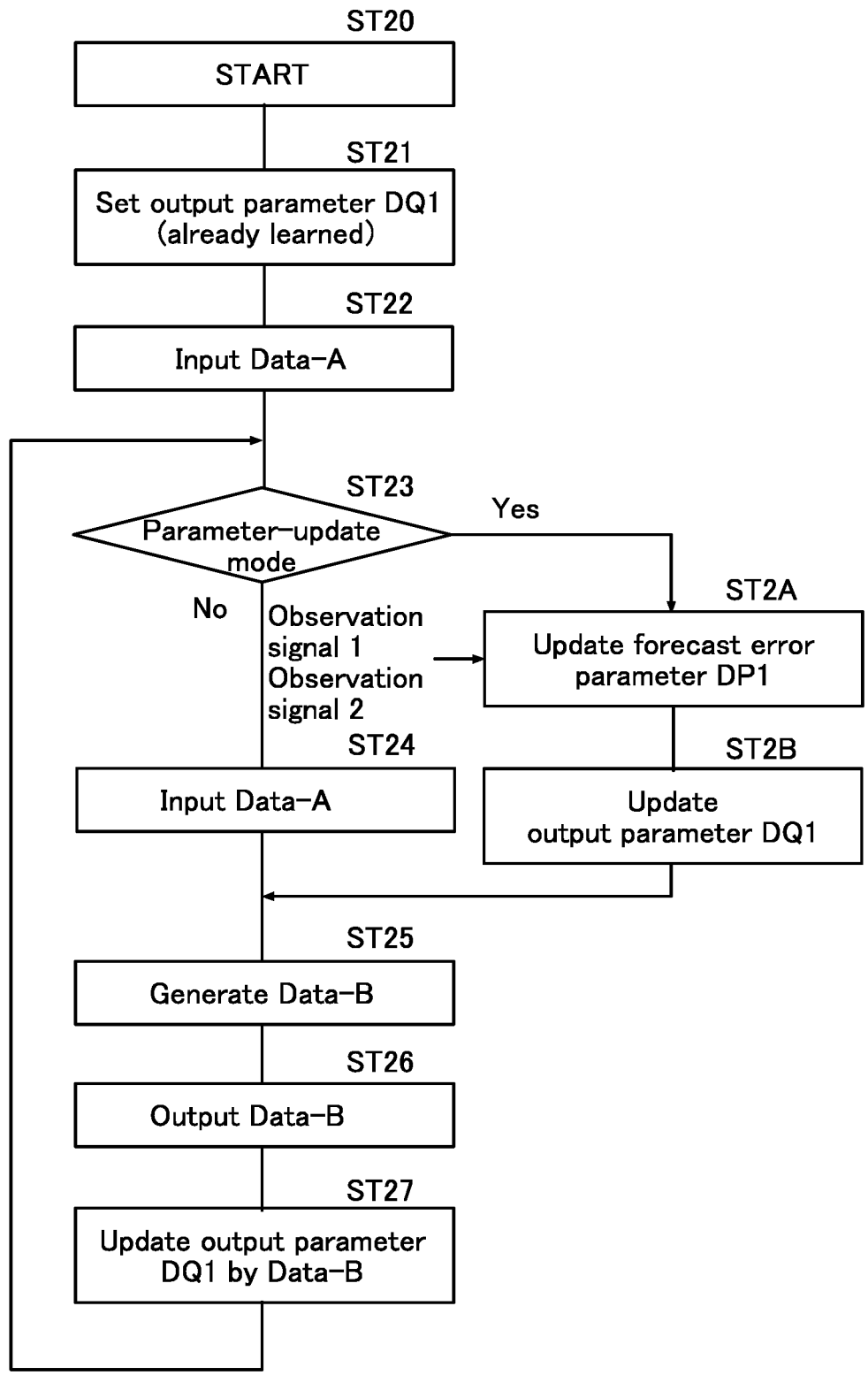
FIG. 3 A flowchart for showing an operation of a display device.

Next, operation of the arithmetic portion 130 is described with reference to a process flowchart in FIG. 3.

Step ST21 is a state in which the second arithmetic portion 132 has already learned to output the output parameter DQ1. Note that the output parameter DQ1 is supplied to the first arithmetic portion 131. An image signal generated by correction of the image signal Data-C is supplied to the pixel 10.

Step ST22 is a step of supplying a new image signal Data-A to the correction arithmetic portion 133.

In Step ST23, the arithmetic portion 130 selects a parameter-update mode. In the parameter-update mode, the signal EN1 supplied to the first arithmetic portion 131 selects a mode. For example, the case where "H" is supplied to the signal EN1 is regarded as a correction mode and the operation goes to Step ST2A to update the forecast error parameter DP1. The case where "L" is supplied to the signal EN1 is regarded as a display mode and the operation goes to Step ST24 to update the output parameter DQ1 without updating the forecast error parameter DP1. First, the parameter-update mode is described. The operation goes to Step ST2A when "H" is supplied to the signal EN1.

In Step ST2A, the observation signal DA1 and the observation signal DA2 are supplied to the first arithmetic portion 131. In this step, the first arithmetic portion 131 updates the forecast error parameter DP1 using the observation signal DA1 and the observation signal DA2 and supplies the forecast error parameter DP1 to the second arithmetic portion 132. Note that a larger number of observation signals such as the observation signal DA3 are preferably supplied to the first arithmetic portion 131.

Step ST2B is a step in which the second arithmetic portion 132 updates the output parameter DQ1 using the forecast error parameter DP1 and supplies the output parameter DQ1 to the correction arithmetic portion 133. Note that the output parameter DQ1 is also supplied to the first arithmetic portion 131.

Step ST25 is a step in which the correction arithmetic portion 133 generates the image signal Data-B from the image signal Data-A using the output parameter DQ1.

Step ST26 is a step in which the source driver supplies the image signal Data-B to the pixel 10.

Step ST27 is a step in which the image signal Data-B is supplied to the second arithmetic portion 132 and the output parameter DQ1 is updated. The operation goes to ST23 again, and when the correction mode continues, the operation goes to the next pixel and the forecast error parameter DP1 and the output parameter DQ1 are updated again to learn the amount of deterioration of the pixel. Note that in the process of updating the forecast error parameter DP1, a correction test signal is preferably supplied to the image signal Data-A. The correction test signal is a fixed image signal Data-A which is suitable for detecting the amount of deterioration of the transistor 12 and the light-emitting element 15.

Next, the case where the operation shifts to the display mode from the correction mode in ST23 is described. In the display mode, image signals with a variety of gray levels are preferably supplied to the image signal Data-A or the image signal Data-C.

Step ST24 is a step in which a new image signal Data-A is supplied to the correction arithmetic portion 133. The forecast error parameter DP1 updated in the correction mode is supplied to the second arithmetic portion 132, and the output parameter DQ1 is updated by the image signal Data-B.

Step ST25 is a step in which the correction arithmetic portion 133 generates the image signal Data-B from the image signal Data-A using the output parameter DQ1.

Step ST26 is a step in which the source driver supplies the image signal Data-B to the pixel 10. The pixel 10 to which the image data Data-B is supplied can perform display with corrected deterioration of the transistor 12 and the light-emitting element 15.

Step ST27 is a step in which the image signal Data-B is supplied to the second arithmetic portion 132 and the output parameter DQ1 is updated. The operation goes to ST23 again, and when the display mode continues, the operation goes to the next pixel and the operation of the display mode continues.

Figure 4A:
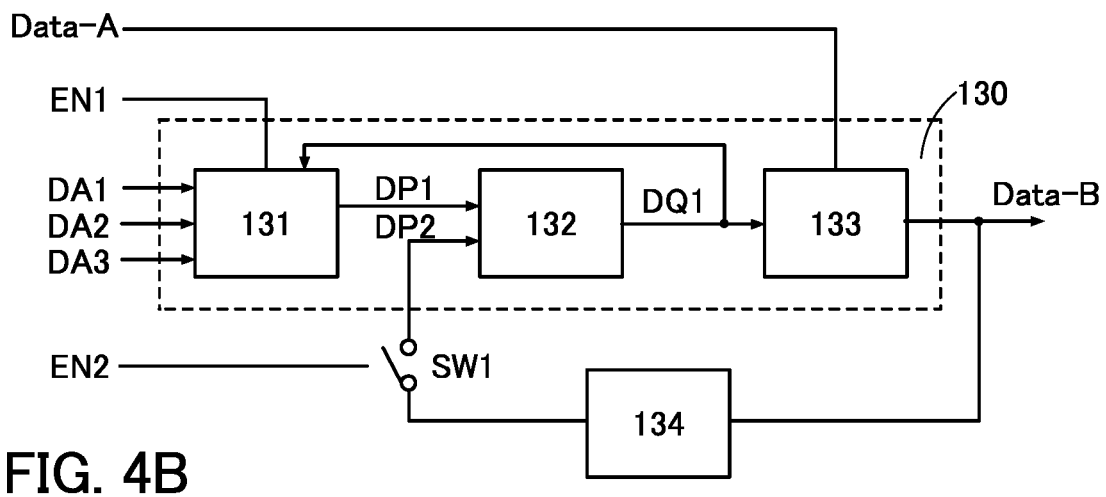
FIGS. 4 (A) and (B) Diagrams illustrating a display device.

The details of a display device different from that in FIG. 2(C) are described with reference to FIG. 4(A). The display device illustrated in FIG. 4(A) includes a circuit 134. The correction arithmetic portion 133 is connected to the switch SW1 through the circuit 134.

Figure 4B:
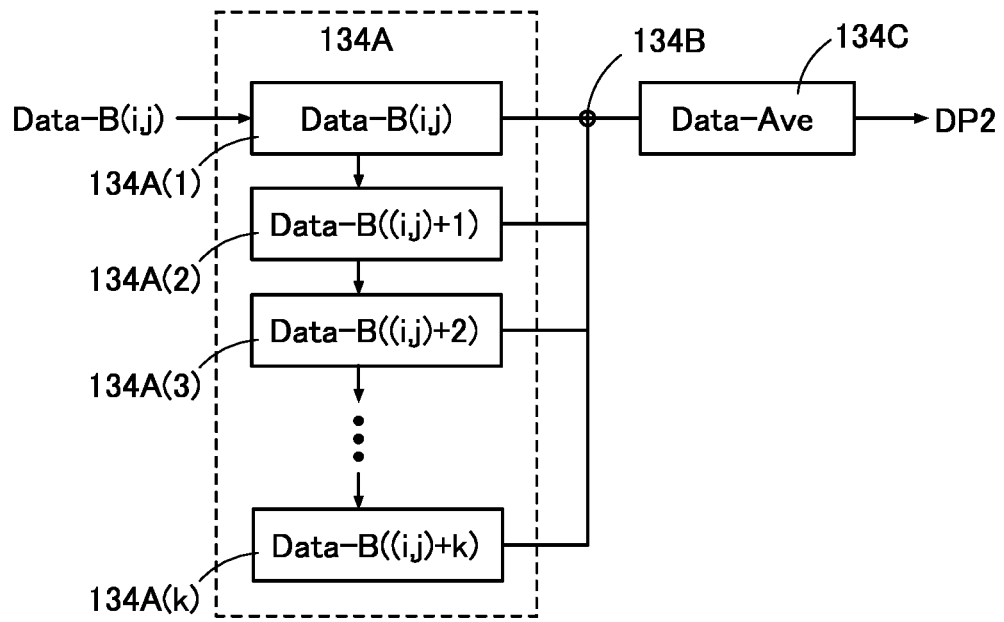

Next, the details of the circuit 134 are described with reference to a block diagram in FIG. 4(B). The circuit 134 includes a circuit 134A, a circuit 134B, and a circuit 134C. The circuit 134A is a shift register including a register 134A(1) to a register 134A(k). It is preferable that k be a positive integer and a power of 2.

For example, at the first time, an image signal Data-B(i,j) supplied to the pixel 10(i,j) is supplied to the register 134A(1).

At the second time, the image signal Data-B(i,j) held in the register 134A(1) is supplied to a register 134A(2) as an image signal Data-B((i,j)+1) and an image signal Data-B(i,j) supplied to the pixel 10(i,j) is newly supplied to the register 134A(1).

At the third time, the image signal Data-B((i,j)+1) held in the register 134A(2) is supplied to a register 134A(3) as an image signal Data-B((i,j)+2), the image signal Data-B(i,j) held in the register 134A(1) is supplied to the register 134A(2) as an image signal Data-B((i,j)+1), and an image signal Data-B(i,j) supplied to the pixel 10(i,j) is newly supplied to the register 134A(1).

Thus, the circuit 134A operates as a shift register that stores the image signal Data-B(i,j) supplied to the register 134A1 in the next register with time. Thus, the circuit 134A includes k shift registers. Note that at the k+1-th time, an image signal Data-B((i,j)+k) supplied first and held in the register 134A(k) is discarded.

The circuit 134B is composed of an addition-averaging circuit. The circuit 134B adds all of the image signals held in the register 134A(1) to the register 134A(k). Since k is a power of 2, the addition results of the image signals held in the register 134A(1) to the register 134A(k) can average out easily by performing a shift operation. For example, when k=8, the average value of the addition results of the image signals can be obtained by 3-bit shift to the right.

The circuit 134C is a register and holds the addition results averaged in the circuit 134B as an image signal Data-Ave. Note that by the signal EN1, the switch SW1 is turned on in accordance with the time when the circuit 134C is updated and the image signal Data-Ave is supplied to the second arithmetic portion 132 as a parameter DP2. Alternatively, the switch SW1 is off until the image signals are held in all of the registers included in the circuit 134A and the switch SW1 is turned on after the image signal Data-Ave is calculated, whereby the averaged addition results can be supplied at each time, which produces an effect in which more observation signals are reflected.

Note that the image signals Data-B held in the register 134A(1) to the register 134A(k) in the circuit 134A may be the image signals Data-B supplied to the same pixel as described above or may be the image signals Data-B supplied to different pixels. In the case where the image signals Data-B are supplied to the same pixel, the amount of deterioration of the same pixel can be corrected. In the case where the image signals Data-B are supplied to different pixels, the amount of deterioration of an adjacent pixel can be reflected in correction.

FIG. 5(A1) is a monitor circuit 124A different from the monitor circuit in FIG. 2(B). The monitor circuit 124A includes a transistor 12T1 and a light-emitting element 15T1 which are both electrically connected in the same manner as those in the pixel 10.

One of a source and a drain of the transistor 12T1 is electrically connected to one electrode of the light-emitting element 15T1. The other electrode of the light-emitting element 15T1 is electrically connected to a terminal M3$a$1. The other of the source and the drain of the transistor 12T1 is electrically connected to a terminal M3$b$1. A gate of the transistor 12T1 is electrically connected to a terminal M3$c$1.

A fixed potential is supplied to the terminal M3$a$1 and a monitoring image signal is supplied to the terminal M3$c$1. Thus, the value of the current flowing through the transistor 12T1 and the light-emitting element 15T1 is supplied to the terminal M3$b$1. The amount of deterioration of the transistor 12T1 and the light-emitting element 15T1 can be detected by the monitoring image signal.

Note that the transistor 12T1 is preferably a transistor having the same size of a channel formation region and the same electrical characteristics as the transistor 12. Alternatively, a transistor with a large channel width may be used. The use of the transistor with a large channel width enables the amount of deterioration of electrical characteristics of the transistor 12T1 to be easily detected.

The monitor circuit 124A can further include a light-emitting element 15T2. One electrode of the light-emitting element 15T2 is electrically connected to a terminal M2(0), and the other electrode of the light-emitting element 15T2 is electrically connected to a terminal M1(0). A fixed potential is supplied to the terminal M1(0). Thus, the value of the current flowing through the light-emitting element 15T2 is supplied to the terminal M2(0). Note that the light-emitting element 15T2 is preferably a light-emitting element having the same electrical characteristics and light output characteristics as the light-emitting element 15.

One or both of the value of currents supplied to the terminal M2(0) and the terminal M3$b$1 are supplied to an observation signal DB1 described in FIG. 5(B).

FIG. 5(A2) is a monitor circuit 124B different from the monitor circuit in FIG. 5(A1). The difference is that the monitor circuit 124B further includes a transistor 12T2 and a transistor 12T3 in FIG. 5(A2). Portions different from those in FIG. 5(A1) are described below.

One of a source and a drain of the transistor 12T2 is electrically connected to a terminal M3$a$2. The other of the source and the drain of the transistor 12T2 is electrically connected to a terminal M3$b$2. A gate of the transistor 12T2 is electrically connected to a terminal M3$c$2.

One of a source and a drain of the transistor 12T3 is electrically connected to a terminal M3$a$3. The other of the source and the drain of the transistor 12T3 is electrically connected to a terminal M3$b$3. A gate of the transistor 12T3 is electrically connected to a terminal M3$c$3.

The transistor 12T1 to the transistor 12T3 are preferably transistors having the same size of channel formation regions and the same electrical characteristics as the transistor 12. Different monitoring image signals can be supplied to the terminal M3$c$1 to the terminal M3$c$3. That is, the amount of deterioration under different operation conditions can be detected when the transistor 12T1 to the transistor 12T3 allow currents with different values to flow.

Moreover, in FIG. 5(A2), the display device 100 includes a monitor circuit 124B2 and the monitor circuit 124B2 includes an optical sensor P1. One electrode of the optical sensor P1 is electrically connected to a terminal MP1, and the other electrode of the optical sensor P1 is electrically connected to a terminal MP2. The optical sensor P1 can detect light output characteristics of one of the light-emitting element 15T1 and the light-emitting element 15T2 to be supplied to the terminal MP2 as a current. Accordingly, the amount of deterioration of light output characteristics of the light-emitting element 15T1 or the light-emitting element 15T2 can be detected from the current flowing through the optical sensor P1. Note that the monitor circuit 124B2 may be included in the display panel.

Note that any one or more of the value of currents supplied to the terminal M3b1 to the terminal M3b3 are supplied to the observation signal DB1 described in FIG. 5(B). The value of current supplied to the terminal MP2 is supplied to an observation signal DB2 described in FIG. 5(B).

FIG. 5(B) is a display device different from that in FIG. 2(C). FIG. 5(B) illustrates an arithmetic portion 130B. The arithmetic portion 130B includes a third arithmetic portion 131a and a fourth arithmetic portion 132a. The third arithmetic portion 131a includes a forecast error parameter DP3 and the fourth arithmetic portion 132a includes an output parameter DQ2.

The observation signal DA1, the observation signal DB1, or the observation signal DB2 is supplied to the third arithmetic portion 131a. The third arithmetic portion 131a updates the forecast error parameter DP3 and supplies it to the fourth arithmetic portion 132a. The fourth arithmetic portion 132a updates the output parameter DQ2, and the correction arithmetic portion 133 generates the image signal Data-B from the image signal Data-A using the output parameter DQ1 and the output parameter DQ2. The image signal Data-B is supplied to the pixel 10 to make the pixel emit light.

That is, the forecast error parameter DP can be managed by the first arithmetic portion 131 focusing on the amount of deterioration of the transistor 12 or the light-emitting element 15 in the pixel 10 and the third arithmetic portion 131a focusing on the amount of deterioration of the transistor 12T or the light-emitting element 15T in the monitor circuit 124. The amount of deterioration of the transistor 12 and the light-emitting element 15 in the pixel can be detected when image signals with a variety of gray levels are supplied to the pixel 10. In contrast, the amount of deterioration of the monitoring transistor 12T or the light-emitting element 15T due to stress fixed under a given condition can be detected in the monitor circuit 124.

Accordingly, the use of a plurality of observation signals enables the display device illustrated in FIG. 5(B) to correct the amount of deterioration of the transistor 12 or the light-emitting element 15 in the pixel 10 and to inhibit the deterioration of display quality in the pixel 10.

Figure 6:
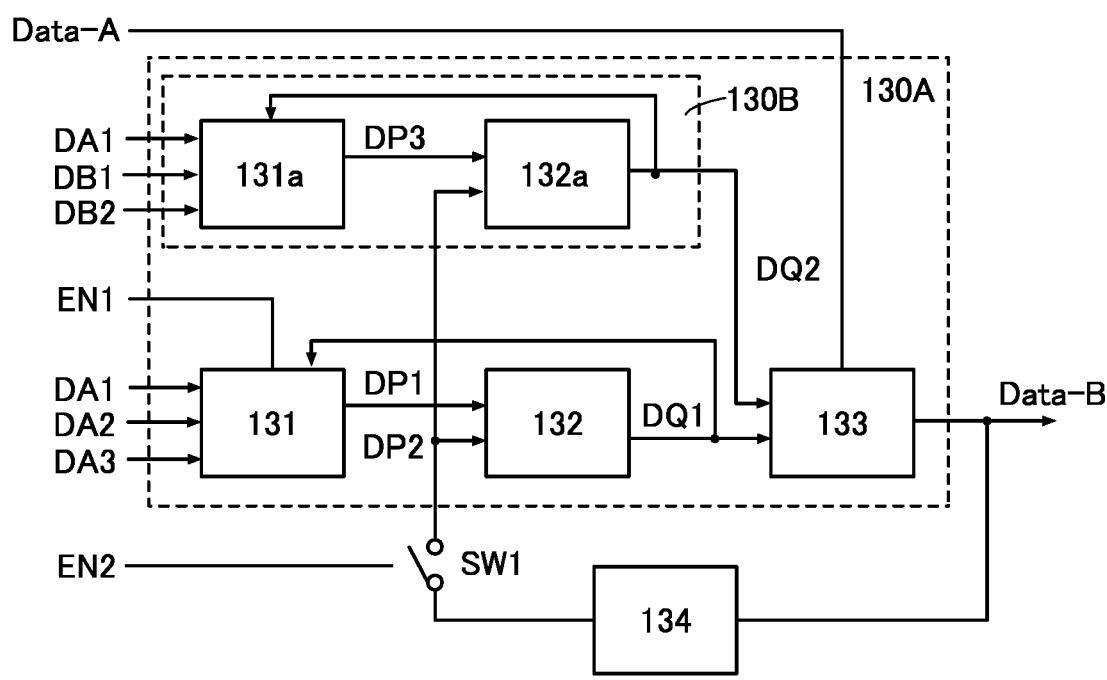
FIG. 6 A diagram illustrating a display device.

FIG. 6 is a display device different from that in FIG. 5(B). FIG. 6 illustrates a structure in which the circuit 134 is combined with an arithmetic portion 130A in FIG. 5(B). The description of the circuit 134 illustrated in FIG. 4 can be referred to for the circuit 134; thus, the description thereof is omitted.

Figure 7A:
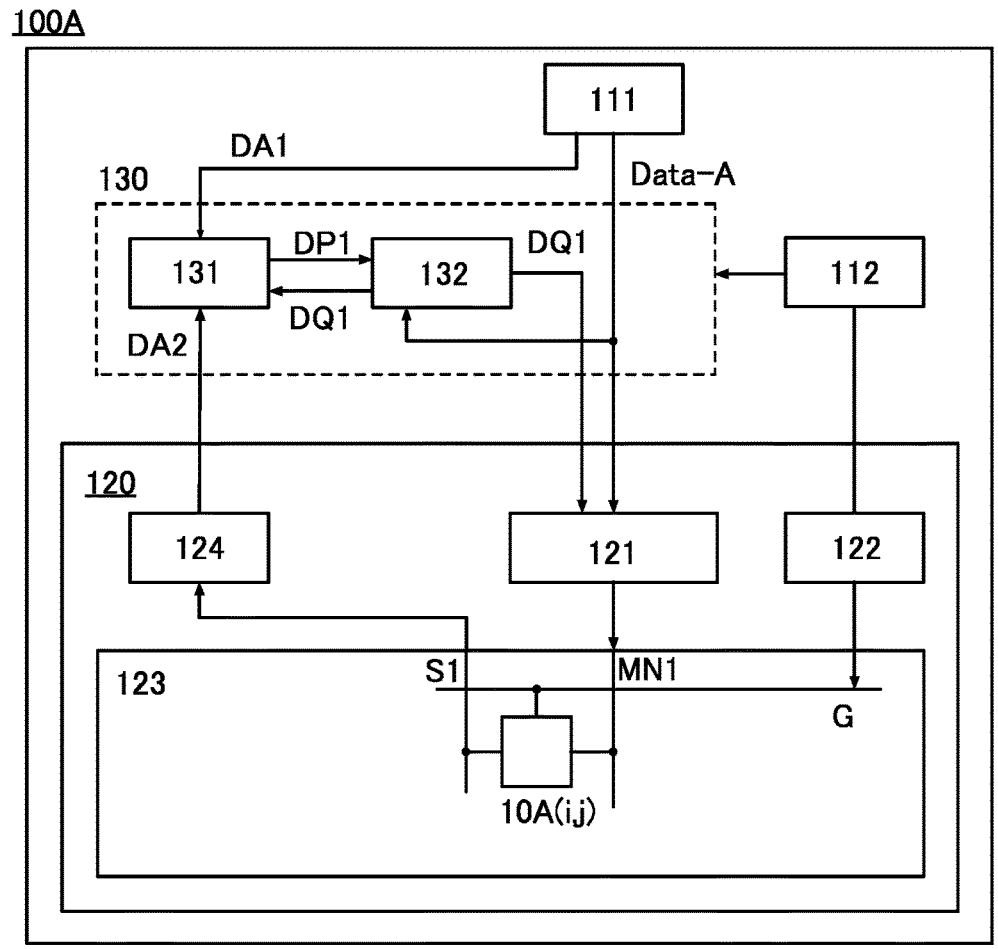
FIG. 7 (A) A diagram illustrating a display device. (B) A diagram illustrating a pixel.

FIG. 7(A) is a display device 100A different from the display device in FIG. 1. The display device 100A is different from the display device 100 in that the correction arithmetic portion 133 is not provided and the display panel 120 includes a plurality of pixels 10A.

Figure 7B:
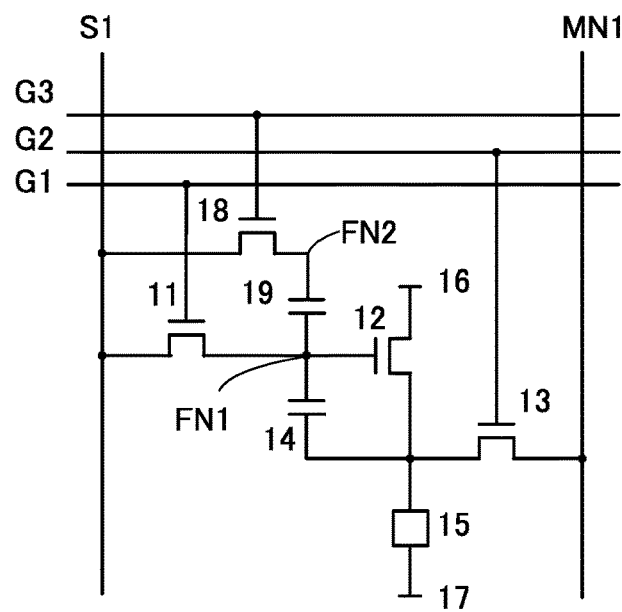

First, the pixel 10A is described with reference to a circuit diagram in FIG. 7(B). Here, portions different from those of the pixel 10 in FIG. 2(A) are described. The display panel 120 includes a wiring G3 and the pixel 10A is connected to the wiring G3. The pixel 10A further includes a transistor 18 and a capacitor 19.

A gate of the transistor 18 is electrically connected to the wiring G3. One of a source and a drain of the transistor 18 is electrically connected to the wiring S1. The other of the source and the drain of the transistor 18 is electrically connected to one electrode of the capacitor 19. The other electrode of the capacitor 19 is electrically connected to the gate of the transistor 12.

A node FN1 is a wiring to which the gate of the transistor 12, one electrode of the capacitor 14, and the other electrode of the capacitor 19 are connected. A node FN2 is a wiring to which the other of the source and the drain of the transistor 18 and the one electrode of the capacitor 19 are connected.

The description of FIG. 7(A) is now resumed. The frame memory 111 can supply the image signal Data-A to the node FN1 in the pixel 10A through the source driver 121. The second arithmetic portion 132 can supply the output parameter DQ1 to the node FN2 in the pixel 10A through the source driver 121. The output parameter DQ1 supplied to the node FN2 is subjected to arithmetic operation with the image data Data-A in the node FN1 through the capacitor 19 and then changed into the image signal Data-B. Thus, the pixels 10A can perform the arithmetic operation similar to that of the correction arithmetic portion 133. The circuit scale can be reduced when the correction arithmetic portion 133 is not provided, and the power consumption can be reduced when the circuit scale is reduced.

Note that the transistor 18 preferably includes an oxide semiconductor film that is highly purified to inhibit the formation of oxygen vacancies. The transistor can have a low off-state current. Accordingly, an electrical signal such as an image signal can be held for a long time. Thus, frequency of refresh operation can be reduced, which leads to lower power consumption. The transistor including the oxide semiconductor film is described in detail in Embodiment 5.

Note that this embodiment can also be applied to a display panel using a liquid crystal element. A pixel using a liquid crystal element includes a transistor and a capacitor. A transistor including an oxide semiconductor film in a semiconductor layer includes a back gate. It is known that the threshold voltage of the transistor can be controlled by controlling the back gate included in the transistor. Thus, it is known that when the transistor deteriorates, the threshold voltage of the transistor is changed and the gray level of the display is changed. Supplying a forecast error parameter to the back gate of the transistor can control the threshold voltage and inhibit the deterioration of display quality of the display panel.

The structure and method described in this embodiment can be used by being combined as appropriate with the structures and methods described in the other embodiments.

Embodiment 2

In this embodiment, a structure example of a display device using a liquid crystal element and a structure example of a display device using a light-emitting element are described. Note that the description of the components, operations, and functions of the display device described in Embodiment 1 is omitted in this embodiment.

The adder circuit and the pixels described in Embodiment 1 can be used in the display device described in this embodiment of the present invention. Note that a scan line driver circuit and a signal line driver circuit which are described below correspond to a gate driver and a source driver, respectively.

Figure 8A:
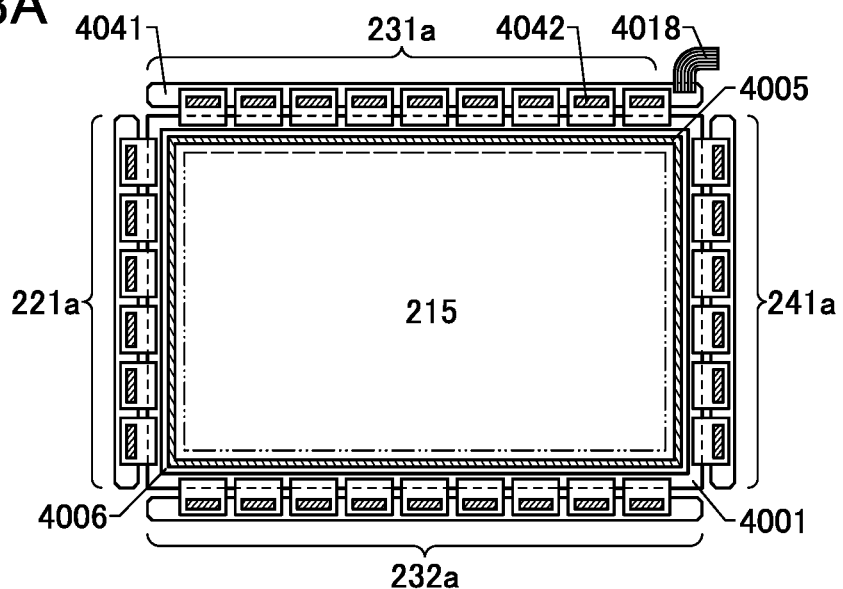
FIG. 8 Diagrams each illustrating a display device.

In FIG. 8(A), a sealant 4005 is provided to surround a display portion 215 provided over a first substrate 4001, and the display portion 215 is sealed with the sealant 4005 and a second substrate 4006.

In FIG. 8(A), a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings Ano, Cath, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COG (Chip On Glass) method, a TCP (Tape Carrier Package) method, a COF (Chip On Film) method, or the like can be used.

Figure 8B:
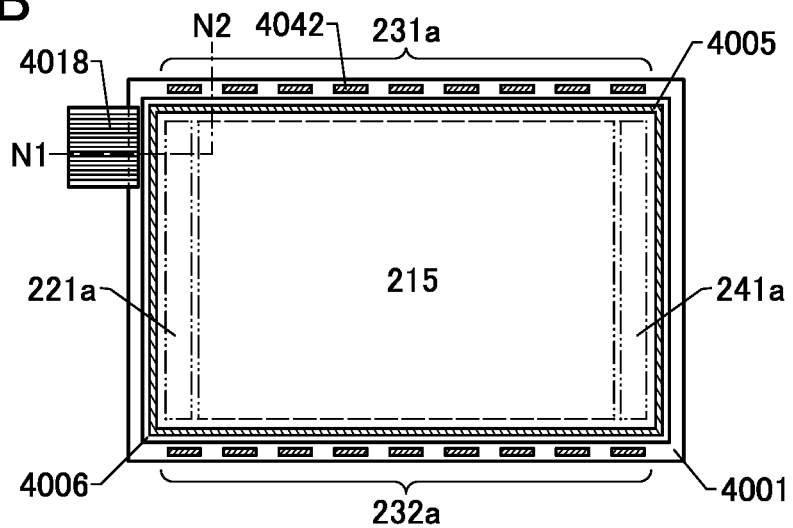

FIG. 8(B) illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 8(B), the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 8(B), the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed together with display elements with the use of the first substrate 4001, the sealant 4005, and the second substrate 4006.

Figure 8C:
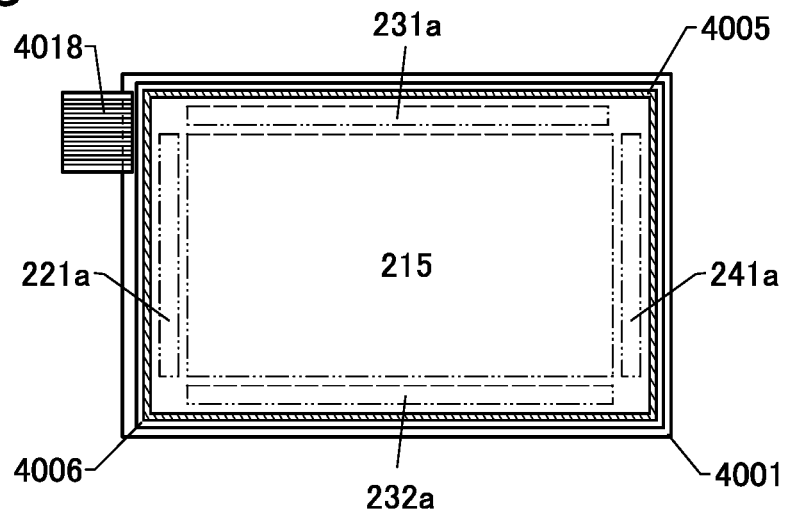

Although the signal line driver circuit 231a and the signal line driver circuit 232a are separately formed and mounted on the first substrate 4001 in the example illustrated in FIG. 8(B), one embodiment of the present invention is not limited to this structure. The scan line driver circuit may be separately formed and then mounted, part of the signal line driver circuits or part of the scan line driver circuits may be separately formed and then mounted. The signal line driver circuit 231a and the signal line driver circuit 232a may be formed over the same substrate as the display portion 215, as illustrated in FIG. 8(C).

In some cases, the display device encompasses a panel in which the display element is sealed, and a module in which an IC or the like including a controller is mounted on the panel.

The display portion and the scan line driver circuit provided over the first substrate each include a plurality of transistors. As the transistors, the transistor described in the above embodiment can be used.

Transistors included in a peripheral driver circuit and transistors included in the pixel circuits of the display portion may have the same structure or different structures. The transistors included in the peripheral driver circuit may have the same structure or a combination of two or more kinds of structures. Similarly, the transistors included in the pixel circuits may have the same structure or a combination of two or more kinds of structures.

An input device 4200 can be provided over the second substrate 4006. The display devices illustrated in FIGS. 8(A) to 8(C) and provided with an input device 4200 can function as a touch panel.

There is no particular limitation on a sensor element included in the touch panel of one embodiment of the present invention. A variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferred because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 9A:
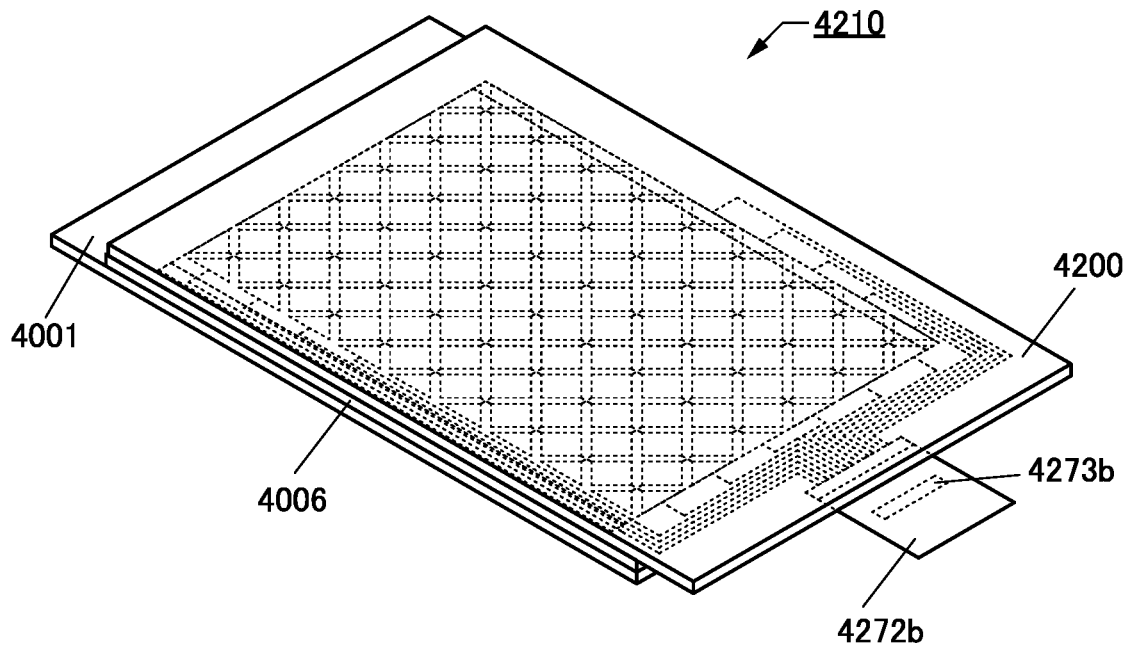
FIG. 9 Diagrams illustrating a touch panel.
Figure 9B:
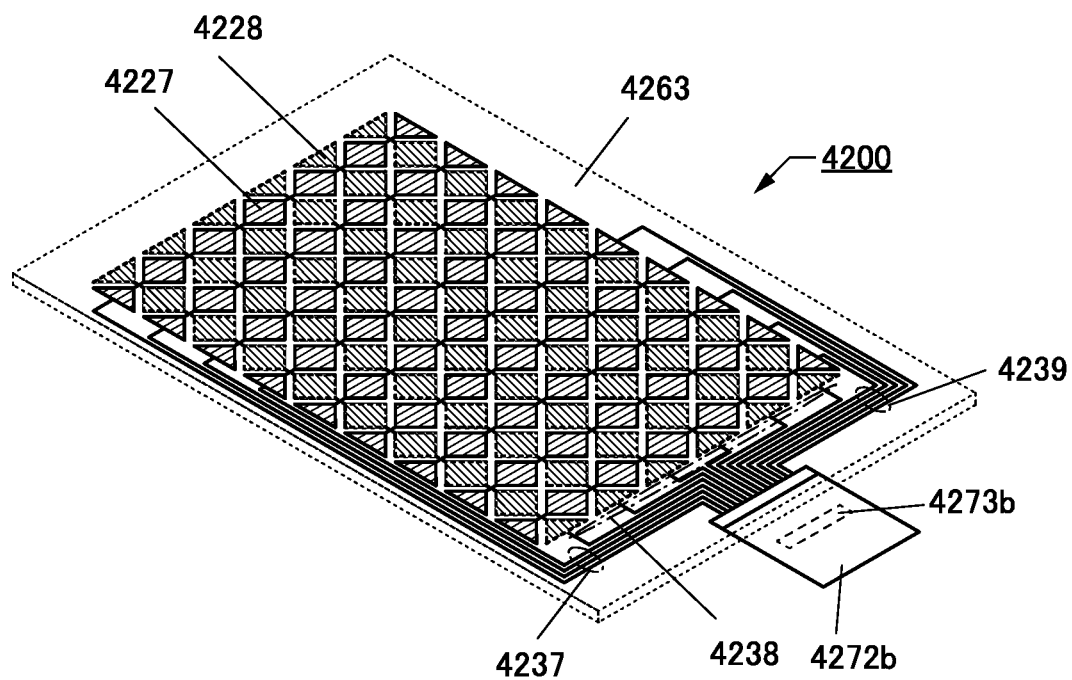

FIGS. 9(A) and 9(B) illustrate an example of the touch panel. FIG. 9(A) is a perspective view of a touch panel 4210. FIG. 9(B) is a schematic perspective view of the input device 4200. Note that for clarity, only typical components are illustrated.

The touch panel 4210 has a structure in which a display device and a sensor element that are separately formed are attached to each other.

The touch panel 4210 includes the input device 4200 and the display device, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the plurality of wirings 4238. An IC 4273b can be provided for the FPC 4272b.

Alternatively, a touch sensor may be provided between the first substrate 4001 and the second substrate 4006 in the display device. In the case where a touch sensor is provided between the first substrate 4001 and the second substrate 4006, either a capacitive touch sensor or an optical touch sensor including a photoelectric conversion element may be used.

FIGS. 10(A) and 10(B) are cross-sectional views of a portion indicated by a dashed-dotted line N1-N2 in FIG. 8(B). Display devices illustrated in FIGS. 10(A) and 10(B) each include an electrode 4015, and the electrode 4015 is electrically connected to a terminal included in the FPC 4018 through an anisotropic conductive layer 4019. In FIGS. 10(A) and 10(B), the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors, and in FIGS. 10(A) and 10(B), the transistor 4010 included in the display portion 215 and the transistor 4011 included in the scan line driver circuit 221a are illustrated as an example. Note that in the examples illustrated in FIGS. 10(A) and 10(B), the transistor 4010 and the transistor 4011 are bottom-gate transistors but may be top-gate transistors.

In FIGS. 10(A) and 10(B), the insulating layer 4112 is provided over the transistor 4010 and the transistor 4011. In FIG. 10(B), a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can function as a back gate electrode.

The display devices illustrated in FIGS. 10(A) and 10(B) each include a capacitor 4020. The capacitor 4020 includes an electrode 4021 formed in the same step as a gate electrode of the transistor 4010 and an electrode formed in the same step as the source electrode and the drain electrode. The electrodes overlap with each other with an insulating layer 4103 therebetween.

In general, the capacitance of a capacitor provided in a pixel portion of a display device is set in consideration of the leakage current or the like of transistors provided in the pixel portion so that charges can be held for a predetermined period. The capacitance of the capacitor may be set in consideration of the off-state current of the transistors or the like.

The transistor 4010 provided in the display portion 215 is electrically connected to the display element. FIG. 10(A) is an example of a liquid crystal display device using a liquid crystal element as the display element. In FIG. 10(A), a liquid crystal element 4013 serving as the display element includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal element having a variety of modes can be used as the liquid crystal element 4013. For example, a liquid crystal element using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (AntiFerroelectric Liquid Crystal) mode, an ECB (Electrically Controlled Birefringence) mode, a VA-IPS mode, a guest-host mode, or the like can be used.

As the liquid crystal display device described in this embodiment, a normally black liquid crystal display device such as a transmissive liquid crystal display device employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal element is an element that controls the transmission and non-transmission of light utilizing an optical modulation action of a liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although FIG. 10 illustrates an example of a liquid crystal display device including a liquid crystal element with a vertical electric field mode, a liquid crystal display device including a liquid crystal element with a horizontal electric field mode can be applied to one embodiment of the present invention. In the case of employing a horizontal electric field mode, a liquid crystal exhibiting a blue phase for which an alignment film is not used may be used. The blue phase is one of the liquid crystal phases, which appears just before a cholesteric phase changes into an isotropic phase when the temperature of a cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains a liquid crystal exhibiting a blue phase and a chiral material has a short response speed and exhibits optical isotropy. In addition, the liquid crystal composition containing a liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display device in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display device illustrated in FIG. 10(A), a light-blocking layer 4132, a coloring layer 4131, and an insulating layer 4133 are provided between the substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the common material because the common manufacturing apparatus can be used and the process can be simplified.

Examples of a material that can be used for the coloring layer include a metal material, a resin material, and a resin material containing a pigment or a dye. The light-blocking layer and the coloring layer may be formed by a method similar to the above-described methods for forming each layer. For example, an inkjet method may be used.

The display devices illustrated in FIGS. 10(A) and 10(B) each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

As the display element included in the display device, a light-emitting element can be used. As the light-emitting element, for example, an EL element that utilizes electroluminescence can be used. An EL element includes a layer containing a light-emitting compound (also referred to as an "EL layer") between a pair of electrodes. A potential difference greater than the threshold voltage of the EL element is generated between the pair of electrodes, whereby holes are injected to the EL layer from the anode side and electrons are injected from the cathode side. The injected electrons and holes are recombined in the EL layer and the light-emitting substance contained in the EL layer emits light.

EL elements are classified depending on whether a light-emitting material is an organic compound or an inorganic compound; in general, the former is referred to as an organic EL element, and the latter is referred to as an inorganic EL element.

In an organic EL element, by voltage application, electrons are injected from one electrode to the EL layer and holes are injected from the other electrode to the EL layer. The carriers (electrons and holes) are recombined, the light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is positioned between dielectric layers, which are further positioned between electrodes, and its light emission mechanism is localization type light emission that utilizes inner-shell electron transition of metal ions. Note that the description is made here using an organic EL element as the light-emitting element.

In order to extract light emitted from the light-emitting element, at least one of the pair of electrodes needs to be transparent. A transistor and a light-emitting element are formed over a substrate; the light-emitting element can have a top emission structure in which light emission is extracted from the surface on the side opposite to the substrate, a bottom emission structure in which light emission is extracted from the surface on the substrate side, or a dual emission structure in which light emission is extracted from both surfaces. The light-emitting element having any of the emission structures can be used.

FIG. 10(B) is an example of a light-emitting display device using a light-emitting element as a display element (also referred to as an "EL display device"). A light-emitting element 4513 serving as the display element is electrically connected to the transistor 4010 provided in the display portion 215. Note that the structure of the light-emitting element 4513 is a stacked-layer structure of the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The partition wall 4510 is formed using an organic insulating material or an inorganic insulating material. The partition wall 4510 is preferably formed in such a manner that it is formed using, especially, a photosensitive resin material, and an opening portion is formed over the first electrode layer 4030 such that a side surface of the opening portion slopes with continuous curvature.

The light-emitting layer 4511 may be formed using a single layer or a plurality of layers stacked.

The emission color of the light-emitting element 4513 can be white, red, green, blue, cyan, magenta, yellow, or the like depending on the material for the light-emitting layer 4511.

As a color display method, there are a method in which the light-emitting element 4513 that emits white light is combined with a coloring layer and a method in which the light-emitting element 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting element 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic-based resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (also called a pixel electrode layer, a common electrode layer, a counter electrode layer, or the like) for applying voltage to the display element each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, what is called a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 11:
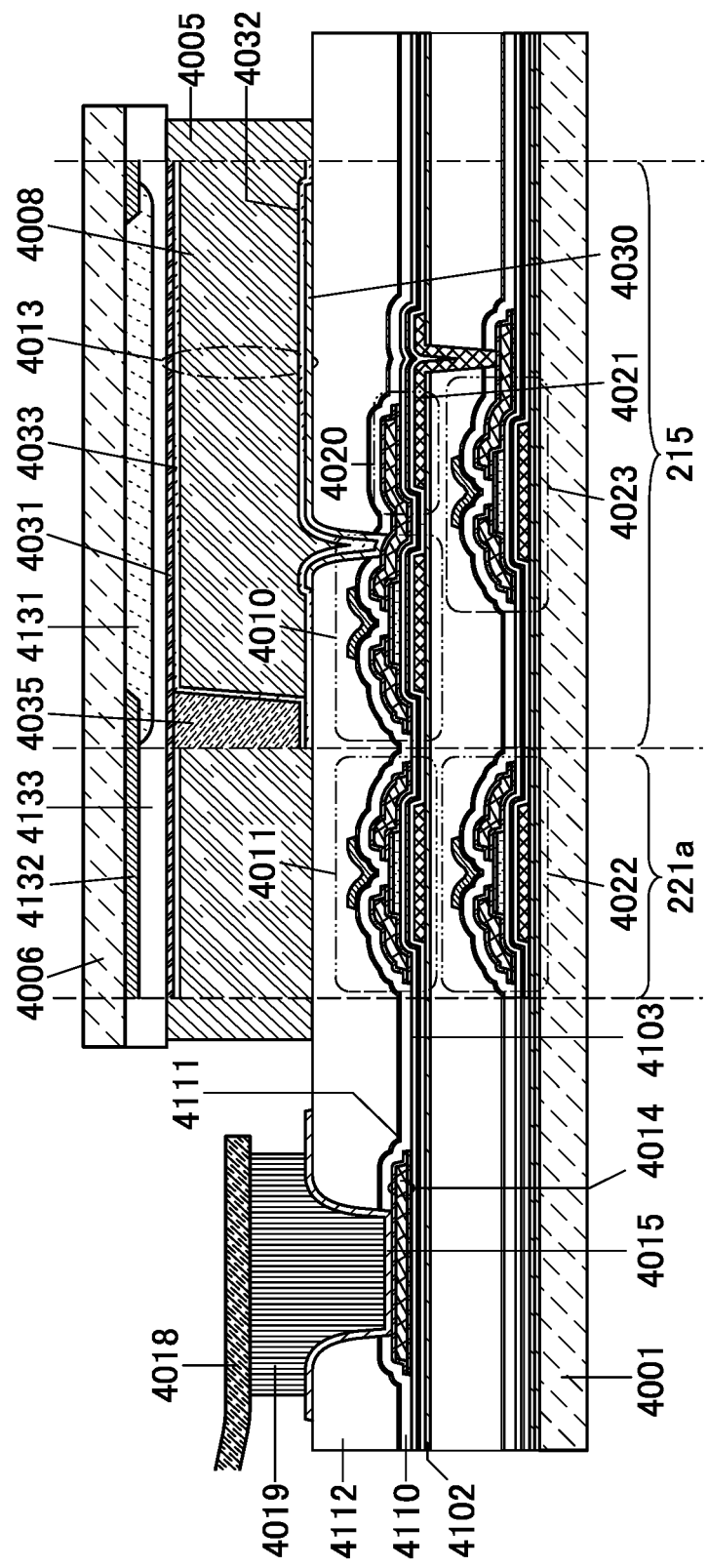
FIG. 11 A diagram illustrating a display device.

Note that as illustrated in FIG. 11, a stacked structure including a region where a transistor and a capacitor overlap with each other in the height direction may be employed. For example, when the transistor 4011 and a transistor 4022 included in the driver circuit are provided to overlap with each other, a display device with a narrow bezel can be provided. Furthermore, when the transistor 4010, a transistor 4023, the capacitor 4020, and the like included in the pixel circuit are provided to at least partly overlap with each other, the aperture ratio and the resolution can be improved. Although FIG. 11 illustrates an example in which the stacked structure is employed for the liquid crystal display device illustrated in FIG. 10(A), the stacked structure may be employed for the EL display device illustrated in FIG. 10(B).

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display device may have a structure with a combination of a liquid crystal display device and a light-emitting device.

The light-emitting device is disposed on the side opposite to the display surface or on an end portion of the display surface. The light-emitting device has a function of supplying light to the display element. The light-emitting device can also be referred to as a backlight.

Here, the light-emitting device can include a plate-like or sheet-like light guide portion (also referred to as a light guide plate) and a plurality of light-emitting elements which emit light of different colors. When the light-emitting elements are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting device to emit light uniformly to a pixel portion of a display panel. Alternatively, the light-emitting device may be provided directly under the pixel without providing the light guide portion.

The light-emitting device preferably includes light-emitting elements of three colors: red (R), green (G), and blue (B). In addition, a light-emitting element of white (W) may be included. A light emitting diode (LED) is preferably used as these light-emitting elements.

Furthermore, the light-emitting elements preferably have extremely high color purities; the full width at half maximum (FWHM) of the emission spectrum of the light-emitting element is less than or equal to 50 nm, preferably less than or equal to 40 nm, more preferably less than or equal to 30 nm, still more preferably less than or equal to 20 nm. Note that the full width at half maximum of the emission spectrum is preferably as small as possible, and can be, for example, greater than or equal to 1 nm. Thus, when color display is performed, a vivid image with high color reproducibility can be displayed.

As the red light-emitting element, an element whose wavelength of an emission spectrum peak is in a range from 625 nm to 650 nm is preferably used. As the green light-emitting element, an element whose wavelength of an emission spectrum peak is in a range from 515 nm to 540 nm is preferably used. As the blue light-emitting element, an element whose wavelength of an emission spectrum peak is in a range from 445 nm to 470 nm is preferably used.

The display device can make the light-emitting elements for the three colors blink sequentially, drive the pixels in synchronization with these light-emitting elements, and perform color display on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, color filters do not need to be provided for the pixels, which can improve the transmittance and achieve brighter image display. In addition, the manufacturing process can be simplified, and thus the manufacturing costs can be reduced.

FIGS. 12(A) and 12(B) are each an example of a schematic cross-sectional view of a display device capable of the field-sequential driving. A backlight unit capable of emitting light of RGB colors is provided on the substrate 4001 side of the display device. Note that in the field-sequential driving, the RGB colors are expressed through time division light emission, and thus color filters are not needed.

A backlight unit 4340a illustrated in FIG. 12(A) has a structure in which a plurality of light-emitting elements 4342 are provided directly under a pixel with a diffusing plate 4352 positioned therebetween. The diffusing plate 4352 have functions of diffusing light emitted from the light-emitting element 4342 to the substrate 4001 side and making the luminance in a display portion uniform. Between the light-emitting element 4342 and the diffusing plate 4352, a polarizing plate may be provided if necessary. The diffusing plate 4352 is not necessarily provided if not needed. The light-blocking layer 4132 may be omitted.

The backlight unit 4340a can include a large number of light-emitting elements 4342, which enables bright image display. Moreover, there are advantages that a light guide plate is not needed and light efficiency of the light-emitting element 4342 is less likely to be lowered. Note that the light-emitting element 4342 may be provided with a light diffusion lens 4344 if necessary.

A backlight unit 4340b illustrated in FIG. 12(B) has a structure in which a light guide plate 4341 is provided directly under a pixel with the diffusing plate 4352 positioned therebetween. The plurality of light-emitting elements 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting element 4342 can be fixed to a printed circuit board 4347. Note that in FIG. 12(B), the light-emitting elements 4342 of RGB colors overlap with each other; however, the light-emitting elements 4342 of RGB colors can be arranged to be lined up in the depth direction. A reflective layer 4348 that reflects visible light may be provided on the side surface of the light guide plate 4341 which is opposite to the light-emitting element 4342.

The backlight unit 4340b can reduce the number of light-emitting elements 4342, leading to reductions in cost and thickness.

A light-scattering liquid crystal element may be used as the liquid crystal element. The light-scattering liquid crystal element is preferably an element containing a composite material of liquid crystal and a polymer molecule. For example, a polymer dispersed liquid crystal element can be used. Alternatively, a polymer network liquid crystal (PNLC) element may be used.

The light-scattering liquid crystal element has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal element performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal element, a difference in a refractive index between the liquid crystal portion and the resin portion becomes small, and incident light along the direction passes without being scattered in the liquid crystal portion. Thus, the light-scattering liquid crystal element is perceived in a transparent state from the direction. In contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal element is in an opaque state regardless of the viewing direction.

FIG. 13(A) illustrates a structure in which the liquid crystal element 4013 of the display device illustrated in FIG. 12(A) is replaced with a light-scattering liquid crystal element 4016. The light-scattering liquid crystal element 4016 includes a composite layer 4009 including a liquid crystal portion and a resin portion and electrode layers 4030 and 4031. Although components relating to the field-sequential driving are the same as those in FIG. 12(A), when the light-scattering liquid crystal element 4016 is used, an alignment film and a polarizing plate are not necessary. Note that the spacer 4035 is illustrated as having a spherical shape, but the spacer 4035 may have a columnar shape.

FIG. 13(B) illustrates a structure in which the liquid crystal element 4013 of the display device illustrated in FIG. 12(B) is replaced with the light-scattering liquid crystal element 4016. In the structure of FIG. 12(B), it is preferable that light be transmitted when a voltage is not applied to the light-scattering liquid crystal element 4016, and light be scattered when a voltage is applied. With such a structure, the display device can be transparent in a normal state (without display). In that case, color display can be performed when light scattering operation is performed.

FIGS. 14(A) to 14(E) illustrate modification examples of the display device in FIG. 13(B). Note that in FIGS. 14(A) to 14(E), some components in FIG. 13(B) are used and the other components are not illustrated for simplicity.

Figure 14A:
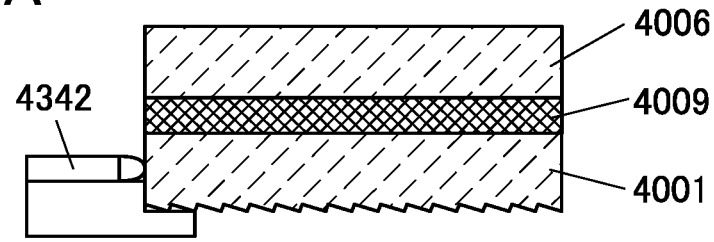
FIG. 14 Diagrams each illustrating a display device.

FIG. 14(A) illustrates a structure in which the substrate 4001 has a function of a light guide plate. An outer surface of the substrate 4001 may have an uneven shape. With this structure, a light guide plate does not need to be provided additionally, leading to a reduction in a manufacturing cost. Furthermore, the attenuation of light caused by the light guide plate also does not occur; accordingly, light emitted from the light-emitting element 4342 can be efficiently utilized.

Figure 14B:
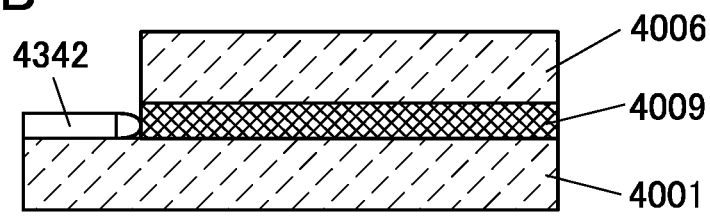

FIG. 14(B) illustrates a structure in which light enters from the vicinity of an end portion of the composite layer 4009. By utilizing total reflection at the interface between the composite layer 4009 and the substrate 4006 and the interface between the composite layer 4009 and the substrate 4001, light can be emitted to the outside from the light-scattering liquid crystal element. For the resin portion of the composite layer 4009, a material having a refractive index higher than that of the substrate 4001 and that of the substrate 4006 is used.

Figure 14C:
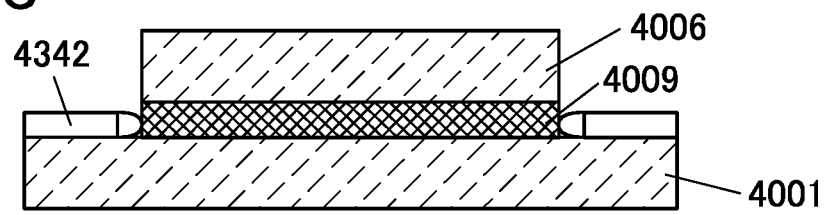

Note that the light-emitting element 4342 is not limited to be provided on one side of the display device, and may be provided on each of two sides facing each other as illustrated in FIG. 14(C). Furthermore, the light-emitting elements 4342 may be provided on three sides or four sides. When the light-emitting elements 4342 are provided on a plurality of sides, attenuation of light can be compensated for and application to a large-area display element is possible.

Figure 14D:
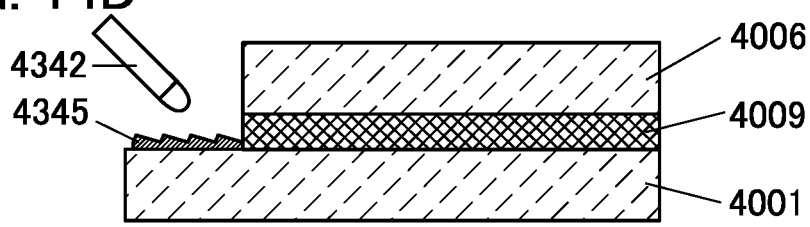

FIG. 14(D) illustrates a structure in which light emitted from the light-emitting element 4342 is guided to the display device through a mirror 4345. With this structure, light can be guided easily with a certain angle to the display device; thus, total reflection light can be obtained efficiently.

Figure 14E:
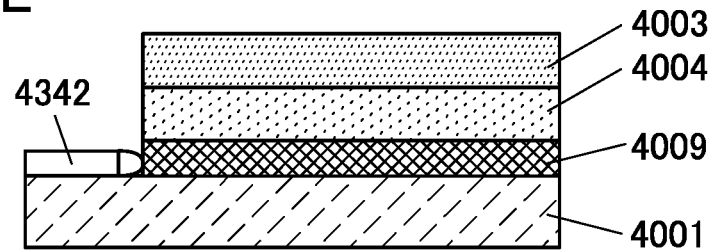

FIG. 14(E) illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through without being totally reflected at the first interface is totally reflected at the second interface and can be returned to the composite layer 4009. Accordingly, light emitted from the light-emitting element 4342 can be efficiently utilized.

Note that the structures in FIG. 13(B) and FIGS. 14(A) to 14(E) can be combined with each other.

This embodiment can be implemented in combination with any of the structures described in the other embodiments and the like, as appropriate.

Embodiment 3

In this embodiment, examples of transistors which can be used instead of the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 15(A1) is a cross-sectional view of a channel-protective transistor 810, which is a type of bottom-gate transistor, in the channel length direction. In FIG. 15(A1), the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 724a and the electrode 724b which are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 724a and the electrode 724b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 724a and between the semiconductor layer 742 and the electrode 724b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 15(A2) is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is sandwiched between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 positioned therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 15(B1) is a cross-sectional view of a channel-protective transistor 820, which has a structure different from FIG. 15(A1), in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 729 that overlaps with the channel formation region can function as a channel protective layer.

A transistor 821 illustrated in FIG. 15(B2) is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

A transistor 825 illustrated in FIG. 15(C1) is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 illustrated in FIG. 15(C2) is different from the transistor 825 in that the electrode 723 that can function as a back gate electrode is provided over the insulating layer 729.

FIGS. 16(A1) to 16(C2) are cross-sectional views of the transistors 810, 811, 820, 821, 825, and 826 in the channel width direction, respectively.

In each of the structures illustrated in FIGS. 16(B2) and 16(C2), the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode or the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 where the channel formation region is formed is electrically surrounded by electric fields of the gate electrode and the back gate electrode, as in the transistor 821 or the transistor 826, can be referred to as a surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 17(A1) is a type of top-gate transistor. The transistor 842 is different from the transistor 810 and the transistor 820 in that the electrode 744a and the electrode 744b are formed after the insulating layer 729 is formed. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity 755 is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity 755 is introduced through the insulating layer 726 has a lower impurity concentration than the semiconductor layer 742 in a region into which the impurity 755 is introduced not through the insulating layer 726. An LDD (Lightly Doped Drain) region is formed in the region of the semiconductor layer 742 that does not overlap with the electrode 746.

A transistor 843 illustrated in FIG. 17(A2) is different from the transistor 842 in that the electrode 723 is included. The transistor 843 includes the electrode 723 that is formed over the substrate 771. The electrode 723 includes a region overlapping with the semiconductor layer 742 with the insulating layer 772 positioned therebetween. The electrode 723 can function as a back gate electrode.

As in a transistor 844 illustrated in FIG. 17(B1) and a transistor 845 illustrated in FIG. 17(B2), the insulating layer 726 in a region that does not overlap with the electrode 746 may be completely removed. Alternatively, as in a transistor 846 illustrated in FIG. 17(C1) and a transistor 847 illustrated in FIG. 17(C2), the insulating layer 726 may be left.

Also in the transistor 842 to the transistor 847, after the formation of the electrode 746, the impurity 755 is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIGS. 18(A1) to 18(C2) are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display device of one embodiment of the present invention include display devices, personal computers, image storage devices or image reproducing devices provided with storage media, cellular phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 19 illustrates specific examples of such electronic devices.

Figure 19A:
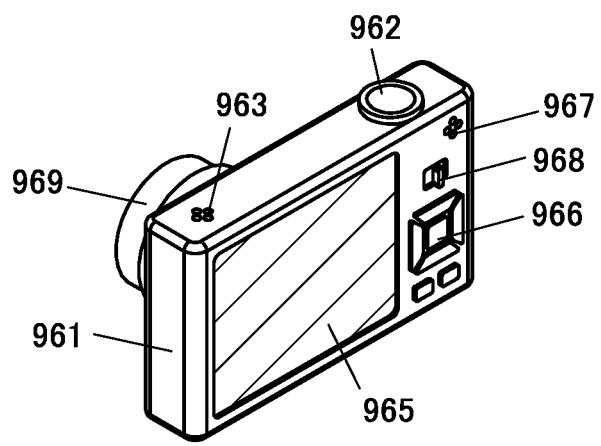
FIG. 19 Diagrams each illustrating an electronic device.

FIG. 19(A) is a digital camera, which includes a housing 961, a shutter button 962, a microphone 963, a speaker 967, a display portion 965, operation keys 966, a zoom lever 968, a lens 969, and the like. The use of the display device of one embodiment of the present invention for the display portion 965 enables display of a variety of images.

Figure 19B:
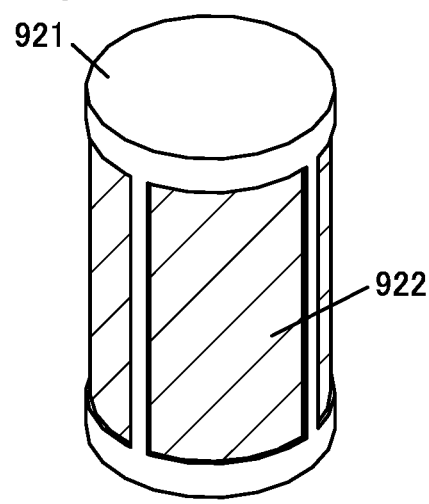

FIG. 19(B) is a digital signage, which has large display portions 922 attached on the side surface of a pillar 921. The use of the display device of one embodiment of the present invention for the display portion 922 enables display with high display quality.

Figure 19C:
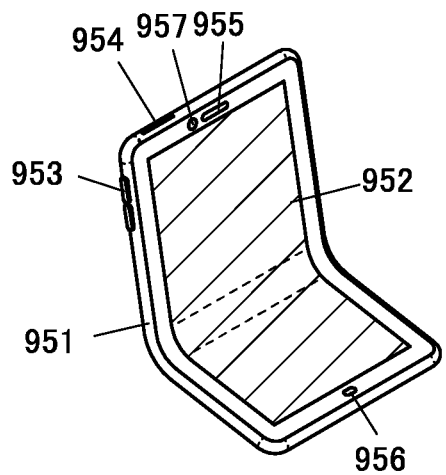

FIG. 19(C) is an example of a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 951 and the display portion 952 have flexibility and can be used in a bent state as illustrated in the drawing. The use of the display device of one embodiment of the present invention for the display portion 952 enables display of a variety of images.

Figure 19D:
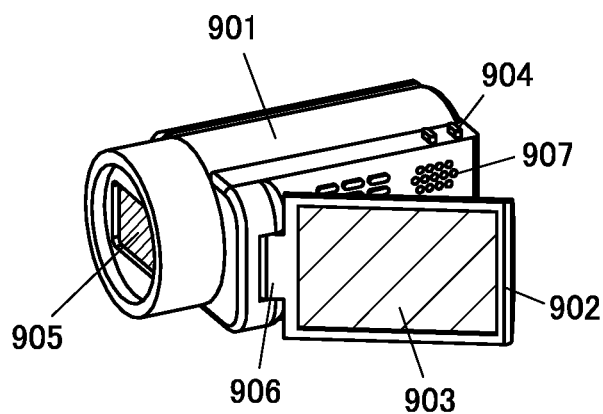

FIG. 19(D) is a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The use of the display device of one embodiment of the present invention for the display portion 903 enables display of a variety of images.

Figure 19E:
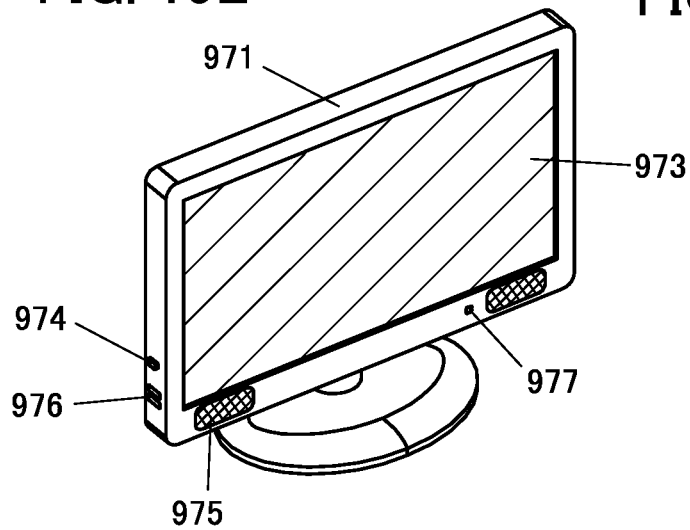

FIG. 19(E) is a television, which includes a housing 971, a display portion 973, an operation key 974, speakers 975, a communication connection terminal 976, an optical sensor 977, and the like. The display portion 973 includes a touch sensor that enables input operation. The use of the display device of one embodiment of the present invention for the display portion 973 enables display of a variety of images.

Figure 19F:
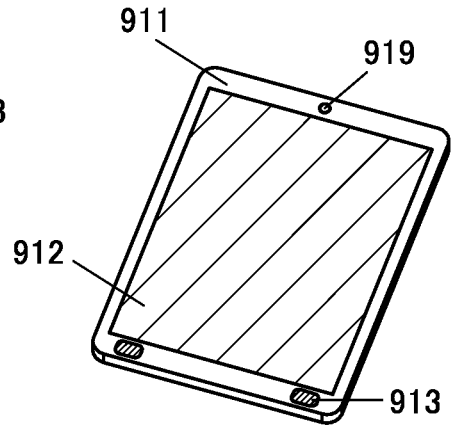

FIG. 19(F) is a portable data terminal, which includes a housing 911, a display portion 912, speakers 913, a camera 919, and the like. A touch panel function of the display portion 912 enables input and output of information. The use of the display device of one embodiment of the present invention for the display portion 912 enables display of a variety of images.

This embodiment can be implemented in combination with any of the structures described in the other embodiments and the like, as appropriate.

Embodiment 5

In this embodiment, a metal oxide that can be favorably used for a channel formation region of a transistor is described.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer is an In-M-Zn-based oxide, it is preferable that the atomic ratio of metal elements of a sputtering target used for forming a film of the In-M-Zn oxide satisfy In≥M and Zn≥M The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering targets in a range of ±40%.

A metal oxide with low carrier density is used for the semiconductor layer. For example, the semiconductor layer can include a metal oxide whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$, and higher than or equal to $1\times10^{-9}/cm^3$. Such a metal oxide is referred to as a highly purified intrinsic or substantially highly purified intrinsic metal oxide. The oxide semiconductor has a low density of defect states and thus can be regarded as a metal oxide semiconductor having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon, which is one of elements belonging to Group 14, is contained in the metal oxide included in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Thus, the concentration of alkali metal or alkaline earth metal of the semiconductor layer, which is measured by secondary ion mass spectrometry, is set to lower than or equal to $1\times10^{18}$ atoms/$cm^3$, preferably lower than or equal to $2\times10^{16}$ atoms/$cm^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to be normally on. Hence, the concentration of nitrogen which is measured by secondary ion mass spectrometry is preferably set to lower than or equal to $5\times10^{18}$ atoms/$cm^3$.

Oxide semiconductors are classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (Cloud-Aligned Composite oxide semiconductor) may be used for a semiconductor layer of a transistor disclosed in one embodiment of the present invention.

For a semiconductor layer of a transistor disclosed in one embodiment of the present invention, the above-described non-single-crystal oxide semiconductor or a CAC-OS can be suitably used. As the non-single-crystal oxide semiconductor, an nc-OS or a CAAC-OS can be suitably used.

In one embodiment of the present invention, a CAC-OS is preferably used for a semiconductor layer of a transistor. The use of a CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

The composition of a CAC (Cloud-Aligned Composite)-OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that a metal oxide preferably contains at least indium. In particular, indium and zinc are preferably contained. In addition, one kind or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that IGZO is a common name and sometimes refers to one compound formed of In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Thus, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

Note that in the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to 0% and lower than or equal to 10%.

The CAC-OS is characterized in that no clear peak is observed in measurement using θ/2θ scan by an out-of-plane method, which is an X-ray diffraction (XRD) measurement method. That is, it is found from the X-ray diffraction measurement that no alignment in the a-b plane direction and the c-axis direction is observed in the measured region.

In an electron diffraction pattern of the CAC-OS which is obtained by irradiation with an electron beam with a probe diameter of 1 nm (also referred to as a nanometer-sized electron beam), a ring-like region with high luminance (a ring region) and a plurality of bright spots in the ring region are observed. Thus, the electron diffraction pattern indicates that the crystal structure of the CAC-OS includes a nanocrystal (nc) structure with no alignment in plan-view and cross-sectional directions.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are phase-separated from each other and form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{x2}Zn_{y2}O_{z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{x2}Zn_{y2}O_{z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{x2}Zn_{y2}O_{z2}$ or $InO_{X1}$ complement each other, whereby a high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow bezel to be provided. Furthermore, the use of the transistor in a signal line driver circuit (particularly in a demultiplexer connected to an output terminal of a shift register included in a signal line driver circuit) in a display device can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra high definition ("4K resolution", "4K2K", and "4K") or super high definition ("8K resolution", "8K4K", and "8K"), in which case writing can be performed in a short time and display defects can be reduced.

Alternatively, silicon may be used as a semiconductor in which a channel of a transistor is formed. As the silicon, amorphous silicon may be used but silicon having crystallinity is preferably used. For example, microcrystalline silicon, polycrystalline silicon, or single-crystal silicon are preferably used. In particular, polycrystalline silicon can be formed at a lower temperature than single-crystal silicon and has higher field-effect mobility and higher reliability than amorphous silicon.

At least part of this embodiment can be implemented in combination with any of the other embodiments described in this specification as appropriate.

REFERENCE NUMERALS

FN1: node, FN2: node, G1: wiring, G2: wiring, G3: wiring, M1: terminal, M2: terminal, M3a: terminal, M3a1: terminal, M3a2: terminal, M3a3: terminal, M3b: terminal, M3b1: terminal, M3b2: terminal, M3b3: terminal, M3c: terminal, M3c1: terminal, M3c2: terminal, M3c3: terminal, MN1: wiring, MP1: terminal, MP2: terminal, P1: optical sensor, S1: switch, SW1: switch, 10: pixel, 10A: pixel, 11: transistor, 12: transistor, 12T: transistor, 12T1: transistor, 12T2: transistor, 12T3: transistor, 13: transistor, 14: capacitor, 15: light-emitting element, 15T: light-emitting element, 15T1: light-emitting element, 15T2: light-emitting element, 16: current-voltage conversion element, 18: transistor, 19: capacitor, 100: display device, 100A: display device, 111: frame memory, 112: timing control portion, 120: display panel, 121: source driver, 122: gate driver, 123: display region, 124: monitor circuit, 124A: monitor circuit, 124B: monitor circuit, 124B2: monitor circuit, 130: arithmetic portion, 130A: arithmetic portion, 130B: arithmetic portion, 131: first arithmetic portion, 131a: third arithmetic portion, 132: second arithmetic portion, 132a: fourth arithmetic portion, 133: correction arithmetic portion, 134: circuit, 134A: circuit, 134B: circuit, 134C: circuit.

The invention claimed is:

1. A method for driving a display device, the display device comprising:
   a pixel comprising a light-emitting element and a transistor;
   a frame memory; and
   an arithmetic circuitry electrically connected to the frame memory,
   the method comprising the steps of:
      supplying a first observation signal and a second observation signal to the arithmetic circuitry;
      updating a forecast error parameter in the arithmetic circuitry by using the first observation signal and the second observation signal in accordance with a regression model;
      updating an output parameter in the arithmetic circuitry by using the forecast error parameter in accordance with the regression model;
      generating a second image signal in the arithmetic circuitry from a first image signal supplied from the frame memory by using the output parameter; and
      supplying the second image signal to the pixel,
   wherein the regression model is a Kalman filter,
   wherein the first observation signal is a third image signal supplied from the frame memory, and
   wherein the second observation signal is a first value of current flowing through one of the light-emitting element and the transistor or a first value of voltage converted from the first value of current.

2. The method for driving the display device according to claim 1,
   wherein the display device further comprises a monitoring transistor, and
   wherein a second value of current flowing through the monitoring transistor or a second value of voltage converted from the second value of current is supplied to the arithmetic circuitry as a third observation signal.

3. The method for driving the display device according to claim 1,
   wherein the display device further comprises a monitoring light-emitting element, and
   wherein a third value of current flowing through the monitoring light-emitting element or a third value of voltage converted from the third value of current is supplied to the arithmetic circuitry as a fourth observation signal.

4. The method for driving the display device according to claim 1,
   wherein the second image signal is generated by the pixel.

5. A method for driving a display device,
   the display device comprising:
      a pixel comprising a light-emitting element and a transistor;
      a frame memory;

an arithmetic circuitry electrically connected to the frame memory; and
a monitor circuit comprising a monitoring transistor and a monitoring light-emitting element, the method comprising the steps of:
supplying a first observation signal, a second observation signal, a third observation signal, and a fourth observation signal to the arithmetic circuitry;
updating a forecast error parameter in the arithmetic circuitry by using the first observation signal, the second observation signal, the third observation signal, and the fourth observation signal in accordance with a regression model;
updating an output parameter in the arithmetic circuitry by using the forecast error parameter in accordance with the regression model;
generating a second image signal in the arithmetic circuitry from a first image signal supplied from the frame memory by using the output parameter; and
supplying the second image signal to the pixel,
wherein the regression model is a Kalman filter,
wherein the first observation signal is a third image signal supplied from the frame memory,
wherein the second observation signal is a first value of current flowing through one of the light-emitting element and the transistor or a first value of voltage converted from the first value of current,
wherein the third observation signal is a second value of current flowing through the monitoring transistor or a second value of voltage converted from the second value of current, and
wherein the fourth observation signal is a third value of current flowing through the monitoring light-emitting element or a third value of voltage converted from the third value of current.

6. The method for driving the display device according to claim 5,
wherein the second image signal is generated by the pixel.

* * * * *